US012785693B2

(12) United States Patent
Kim et al.

(10) Patent No.: US 12,785,693 B2
(45) Date of Patent: Nov. 3, 2026

(54) UNIVERSAL LOGIC MEMORY CELL

(71) Applicant: KOREA UNIVERSITY RESEARCH AND BUSINESS FOUNDATION, Seoul (KR)

(72) Inventors: Sang Sig Kim, Seoul (KR); Kyoung Ah Cho, Seoul (KR); Jong Seong Han, Chungcheongnam-do (KR); Jae Min Son, Seongnam-si (KR); Ju Hee Jeon, Seoul (KR); Yun Woo Shin, Gwangmyeong-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 49 days.

(21) Appl. No.: 18/948,362

(22) Filed: Nov. 14, 2024

(65) Prior Publication Data

US 2025/0211236 A1 Jun. 26, 2025

(30) Foreign Application Priority Data

Dec. 26, 2023 (KR) ........................ 10-2023-0191705

(51) Int. Cl.
*H03K 19/1776* (2020.01)
*H03K 19/20* (2006.01)
(Continued)

(52) U.S. Cl.
CPC ......... *H03K 19/1776* (2013.01); *H03K 19/20* (2013.01); *H10B 99/00* (2023.02); *H10D 30/611* (2025.01)

(58) Field of Classification Search
CPC ............... H03K 19/1776; H03K 19/20; H03K 19/09421; H03K 19/0944; H03K 19/215;
(Continued)

(56) References Cited

U.S. PATENT DOCUMENTS

2023/0170907 A1 6/2023 Kang et al.
2025/0061940 A1* 2/2025 Kim .................... G11C 11/4094
2025/0275117 A1* 8/2025 Kim ....................... H10B 12/20

FOREIGN PATENT DOCUMENTS

KR 20200129466 A * 11/2020 ........... G11C 11/412
KR 10-2022-0014996 A 2/2022
(Continued)

OTHER PUBLICATIONS

The extended European search report issued by the European Patent Office on May 19, 2025, which corresponds to European Patent Application No. 24212993.0-1211 and is related to U.S. Appl. No. 18/948,362.
(Continued)

*Primary Examiner* — Seokjin Kim
(74) *Attorney, Agent, or Firm* — Studebaker Brackett PLLC

(57) ABSTRACT

The present disclosure relates to a universal logic memory cell composed of triple-gate silicon devices. The universal logic memory cell according to one embodiment of the present disclosure may perform a ternary logic operation function and a memory function using triple-gate silicon devices driven by a positive feedback loop.

14 Claims, 13 Drawing Sheets

(51) Int. Cl.
*H10B 99/00* (2023.01)
*H10D 30/60* (2025.01)

(58) Field of Classification Search
CPC ...... H10B 99/00; H10B 99/22; H10D 30/611; H10D 12/021; H10D 12/211; H10D 64/311; G11C 11/54; G11C 11/41
See application file for complete search history.

(56) References Cited

FOREIGN PATENT DOCUMENTS

| | | | | |
|---|---|---|---|---|
| KR | 10-2481855 | B1 | 12/2022 | |
| KR | 102475066 | B1 * | 12/2022 | ........... H01L 27/098 |
| KR | 10-2023-0020840 | A | 2/2023 | |
| KR | 10-2023-0053195 | A | 4/2023 | |

OTHER PUBLICATIONS

Son et al.; "Logic-In-Memory Operation of Ternary NAND/NOR Universal Logic Gates using Double-Gated Feedback Field-Effect Transistors"; Advanced Electronic Materials; Jan. 1, 2023; pp. 1-9; vol. 9; Wiley Advanced; URL: https://advanced.onlinelibrary.wiley.com/doi/10.1002/aelm.202201134.
Office Action issued in KR 10-2023-0191705; mailed by the Korean Intellectual Property Office on Apr. 4, 2025.

* cited by examiner

UNIVERSAL LOGIC MEMORY CELL

CROSS-REFERENCE TO RELATED APPLICATION

This application claims priority to Korean Patent Application No. 10-2023-0191705, filed on Dec. 26, 2023, in the Korean Intellectual Property Office, the disclosure of which is incorporated herein by reference.

BACKGROUND OF THE DISCLOSURE

Field of the Disclosure

The present disclosure relates to a universal logic memory cell composed of triple-gate silicon devices, and more particularly, to technology for implementing a universal logic memory cell that provides ternary logic operation function and memory function using a triple-gate silicon device driven by a positive feedback loop.

Description of the Related Art

In existing von Neumann-based computer systems, a processor and a memory are separated and data is transmitted through a bus.

However, as computing performance improved, bottlenecks occurred due to the difference in data processing speed between the processor and memory, and limitations in processing large amounts of data began to appear.

That is, the von Neumann-based system, a revolutionary development in the semiconductor industry, improved the integration density and performance of modern computers, but the von Neumann-based system has the disadvantages of consuming a lot of energy and having long data transmission time and latency time due to the physical separation between the processor and memory hierarchy.

Given the increase of data-intensive applications such as 5G communication standards, the Internet of Things (IoT), and artificial intelligence (AI) following the Fourth Industrial Revolution, new computing paradigms are essential to meet massive data processing requirements.

To solve the above-mentioned problems, research on logic memory technology that combines computational and memory functions is being focused and accelerated.

Since the logic memory technology performs the computational function of a processor and the memory function of a memory in the same space, the logic memory technology can reduce delay time and power consumption that occur during data transmission and greatly improve the integration of a system.

Conventional logic memory technology has been actively studied based on volatile memory devices such as static random access memory (SRAM) and dynamic RAM (DRAM), and nonvolatile memory devices such as resistive RAM (ReRAM), magnetoresistive RAM (MRAM), and phase-change RAM (PCRAM).

In the case of logic memory technology based on volatile memory devices, a large number of transistors are required for stable operation, which limits the overall area and power consumption.

In addition, logic memory technology based on nonvolatile memory devices requires a complex process using non-silicon materials, and is difficult to commercialize due to low device uniformity and stability.

In addition, previously studied logic memory technologies cannot implement all basic CMOS logic operations in a single cell and have low integration as individual circuits and wiring are required depending on the logic operation.

Therefore, there is a need to develop a universal logic memory cell that can be manufactured using a silicon-based CMOS process and performs all basic logic operations and stores values within a single cell.

The conventional logic memory technology has been researched using various memories including volatile memory devices such as dynamic random access memory (DRAM) and static RAM (SRAM) and nonvolatile memory devices such as phase-change RAM (PRAM), resistive RAM (ReRAM), and magnetoresistive RAM (MRAM).

However, these memories cannot define n-channel and p-channel, making it difficult to apply the memories to existing CMOS logic operations.

In particular, logic-memory technologies based on nonvolatile memory devices mostly require new processes other than silicon-based CMOS processes, and are difficult to commercialize due to low device uniformity and reliability.

In addition, to overcome the information density limitations of existing CMOS binary logic systems, multiple-valued logic systems with more than two logic states are being studied using various devices, but the systems commonly have the problem of high power consumption because the systems utilize leakage current flowing through the devices.

In particular, devices using negative differential resistance (NDR), negative differential transconduction (NDT), and quantum dots (QDs) based on the tunneling principle have limitations in reliability and operating temperature, making it difficult to apply the devices to multiple-valued logic systems.

Accordingly, conventional binary logic operation methods have limitations in relatively improving integration and information density.

SUMMARY OF THE DISCLOSURE

Therefore, the present disclosure has been made in view of the above problems, and it is an object of the present disclosure to implement a universal logic memory cell that provides ternary logic operation function and memory function using a triple-gate silicon device driven by a positive feedback loop.

It is another object of the present disclosure to implement a universal logic memory cell that performs all ternary basic logic operations in a single structure using a triple-gate silicon device and stores the results of the operations.

It is still another object of the present disclosure to implement a universal logic memory cell using a triple-gate silicon device, which is a silicon-based feedback memory device using a conventional CMOS process.

It is still another object of the present disclosure to improve processing speed and integration limitation due to data bottleneck through the fusion of logical operation and storage function.

It is yet another object of the present disclosure to improve standby power efficiency by using channel mode reconfiguration characteristics and excellent memory characteristics that maintain logical operation values without structural changes and external biases.

In accordance with one aspect of the present disclosure, provided is a universal logic memory cell including a first network device and a second network device using a plurality of triple-gate silicon devices, wherein each of the triple-gate silicon devices includes a drain region, a channel region, and a source region; a supply voltage is applied to the drain region and the source region; a gate region on which first and second programming gate electrodes and a control gate electrode are formed is formed on the channel region; depending on a level of a program voltage ($V_{PG}$) applied through the first and second programming gate electrodes, the channel region under the first and second programming gate electrodes operates in one of a first channel mode and a second channel mode; and the triple-gate silicon device is determined to be in either an on-state or an off-state based on a level of a control voltage ($V_{CG}$) applied through the control gate electrode, and the first and second network devices perform a ternary logic operation function and a memory function by determining a level of an output voltage ($V_{OUT}$) as one of a positive level, a zero level, and a negative level depending on any one of the states in any one of the channel modes.

The first and second network devices may be composed of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween, a drain voltage ($V_{DD}$) of the common voltage may be applied through the first parallel connection of the first network device, a source voltage ($V_{SS}$) of the common voltage may be applied through the second parallel connection of the second network device, and an output voltage ($V_{OUT}$) may be measured at a point where the second parallel connection of the first network device and the first parallel connection of the second network device are connected.

When the first network device operates in the second channel mode and the second network device operates in the first channel mode, the ternary logic operation function of determining a level of the output voltage ($V_{OUT}$) as a positive level when a level of the control voltage ($V_{CG}$) is a negative level, determining a level of the output voltage ($V_{OUT}$) as a negative level when a level of the control voltage ($V_{CG}$) is a positive level, and determining a level of the output voltage ($V_{OUT}$) as a zero level when a level of the control voltage ($V_{CG}$) is a zero level may be performed.

When the first network device operates in the first channel mode and the second network device operates in the second channel mode, the ternary logic operation function of determining a level of the output voltage ($V_{OUT}$) as a negative level when a level of the control voltage ($V_{CG}$) is a negative level, determining a level of the output voltage ($V_{OUT}$) as a positive level when a level of the control voltage ($V_{CG}$) is a positive level, and determining a level of the output voltage ($V_{OUT}$) as a zero level when a level of the control voltage ($V_{CG}$) is a zero level may be performed.

The ternary logic operation function of determining a level of the output voltage ($V_{OUT}$) as a positive level when the first network device operates in the second channel mode, the second network device operates in the first channel mode, a first control voltage ($V_{IN1}$) of the control voltage ($V_{CG}$) is applied to a left side of the first network device and an upper side of the second network device, a second control voltage ($V_{IN2}$) of the control voltage ($V_{CG}$) is applied to a right side of the first network device and a lower side of the second network device, and any one level of levels of the first control voltage ($V_{IN1}$) and the second control voltage ($V_{IN2}$) is a negative level, determining a level of the output voltage ($V_{OUT}$) as a negative level when levels of the first control voltage ($V_{IN1}$) and the second control voltage ($V_{IN2}$) are both positive levels, and determining a level of the output voltage ($V_{OUT}$) as a zero level when levels of the first control voltage ($V_{IN1}$) and the second control voltage ($V_{IN2}$) are both zero levels or one level is a zero level and the other level is a positive level may be performed.

The ternary logic operation function of determining a level of the output voltage ($V_{OUT}$) as a negative level when the first network device operates in the second channel mode, the second network device operates in the first channel mode, a first control voltage ($V_{IN1}$) of the control voltage ($V_{CG}$) is applied to an upper side of the first network device and a left side of the second network device, a second control voltage ($V_{IN2}$) of the control voltage ($V_{CG}$) is applied to a lower side of the first network device and a right side of the second network device, and any one level of levels of the first control voltage ($V_{IN1}$) and the second control voltage ($V_{IN2}$) is a positive level, determining a level of the output voltage ($V_{OUT}$) as a positive level when levels of the first control voltage ($V_{IN1}$) and the second control voltage ($V_{IN2}$) are both negative levels, and determining a level of the output voltage ($V_{OUT}$) as a zero level when levels of the first control voltage ($V_{IN1}$) and the second control voltage ($V_{IN2}$) are both zero levels or one level is a zero level and the other level is a negative level may be performed.

The ternary logic operation function of determining a level of the output voltage ($V_{OUT}$) as a negative level when the first network device operates in the first channel mode, the second network device operates in the second channel mode, a first control voltage ($V_{IN1}$) of the control voltage ($V_{CG}$) is applied to an upper side of the first network device and a left side of the second network device, a second control voltage ($V_{IN2}$) of the control voltage ($V_{CG}$) is applied to a lower side of the first network device and a right side of the second network device, and any one level of levels of the first control voltage ($V_{IN1}$) and the second control voltage ($V_{IN2}$) is a negative level, determining a level of the output voltage ($V_{OUT}$) as a positive level when levels of the first control voltage ($V_{IN1}$) and the second control voltage ($V_{IN2}$) are both positive levels, and determining a level of the output voltage ($V_{OUT}$) as a zero level when levels of the first control voltage ($V_{IN1}$) and the second control voltage ($V_{IN2}$) are both zero levels or any one level is a zero level and the other level is a positive level may be performed.

The ternary logic operation function of determining a level of the output voltage ($V_{OUT}$) as a positive level when the first network device operates in the second channel mode, the second network device operates in the first channel mode, a first control voltage ($V_{IN1}$) of the control voltage ($V_{CG}$) is applied to a left side of the first network device and an upper side of the second network device, a second control voltage ($V_{IN2}$) of the control voltage ($V_{CG}$) is applied to a right side of the first network device and a lower side of the second network device, and any one level of levels of the first control voltage ($V_{IN1}$) and the second control voltage ($V_{IN2}$) is a positive level, determining a level of the output voltage ($V_{OUT}$) as a negative level when levels of the first control voltage ($V_{IN1}$) and the second control voltage ($V_{IN2}$) are both negative levels, and determining a level of the output voltage ($V_{OUT}$) as a zero level when levels of the first control voltage ($V_{IN1}$) and the second control voltage ($V_{IN2}$) are both zero levels or any one level is a zero level and the other level is a negative level may be performed.

The ternary logic operation function of determining a level of the output voltage ($V_{OUT}$) as a positive level when a left side of the first network device operates in the first channel mode, a right side of the first network device operates in the second channel mode, an upper left side of the second network device operates in the second channel mode, an upper right side of the second network device operates in the first channel mode, a lower left side of the second network device operates in the first channel mode, a lower right side of the second network device operates in the second channel mode, a first control voltage ($V_{IN1}$) of the control voltage ($V_{CG}$) is applied to an upper side of the first and second network devices, a second control voltage ($V_{IN2}$) of the control voltage ($V_{CG}$) is applied to a lower side of the first and second network devices, and levels of the first control voltage ($V_{IN1}$) and the second control voltage ($V_{IN2}$) are both negative or positive levels, determining a level of the output voltage ($V_{OUT}$) as a negative level when levels of the first control voltage ($V_{IN1}$) and the second control voltage ($V_{IN2}$) are opposite to each other and are negative or positive levels, and determining a level of the output voltage ($V_{OUT}$) as a zero level when any one level of levels of the first control voltage ($V_{IN1}$) and the second control voltage ($V_{IN2}$) is a zero level may be performed.

The ternary logic operation function of determining a level of the output voltage ($V_{OUT}$) as a negative level when an upper left side of the first network device operates in the second channel mode, an upper right side of the first network device operates in the first channel mode, a lower left side of the first network device operates in the first channel mode, a lower right side of the first network device operates in the second channel mode, a left side of the second network device operates in the first channel mode, a right side of the second network device operates in the second channel mode, a first control voltage ($V_{IN1}$) of the control voltage ($V_{CG}$) is applied to an upper side of the first and second network devices, a second control voltage ($V_{IN2}$) of the control voltage ($V_{CG}$) is applied to a lower side of the first and second network devices, and levels of the first control voltage ($V_{IN1}$) and the second control voltage ($V_{IN2}$) are both positive levels, determining a level of the output voltage ($V_{OUT}$) as a negative level when levels of the first control voltage ($V_{IN1}$) and the second control voltage ($V_{IN2}$) are both negative levels, outputting a level of the output voltage ($V_{OUT}$) as a positive level when levels of the first control voltage ($V_{IN1}$) and the second control voltage ($V_{IN2}$) are opposite to each other and are negative or positive levels, and determining a level of the output voltage ($V_{OUT}$) as a zero level when either of levels of the first control voltage ($V_{IN1}$) and the second control voltage ($V_{IN2}$) is a zero level may be performed.

The drain region may be in a p-doped state; the source region may be in an n-doped state; the channel region may be in an intrinsic state; and the channel region under the first and second programming gate electrodes may operate as an n-channel corresponding to the first channel mode when a level of the program voltage ($V_{PG}$) is a positive level and may operate as a p-channel corresponding to the second channel mode when a level of the program voltage ($V_{PG}$) is a negative level.

When a drain voltage ($V_{DD}$) applied to the drain region, a source voltage ($V_{SS}$) applied to the source region, the program voltage ($V_{PG}$), and the control voltage ($V_{CG}$) are applied at a zero level, the memory function may be performed by maintaining a level of the output voltage ($V_{OUT}$).

When the channel region under the first and second programming gate electrodes operates in the first channel mode, each of the triple-gate silicon devices may be determined to be in an on-state when a level of the applied control gate voltage ($V_{CG}$) is higher than a latch-up voltage, which is a voltage at which current increases rapidly, and may be determined to be in an off-state when a level of the applied control gate voltage ($V_{CG}$) is lower than the latch-up voltage.

When the channel region under the first and second programming gate electrodes operates in the first channel mode and a level of the applied control voltage ($V_{CG}$) is higher than the latch-up voltage, each of the triple-gate silicon devices may have a lowered potential barrier height between the channel region under the control gate electrode and the channel region under the second programming gate electrode adjacent to the source region and may become the on-state, where current flows due to a first positive feedback loop in which electrons are injected from the source region due to the lowered potential barrier.

When the channel region under the first and second programming gate electrodes operates in the second channel mode, each of the triple-gate silicon devices may be determined to be in an off-state when a level of the applied control gate voltage ($V_{CG}$) is higher than a latch-up voltage, which is a voltage at which current increases rapidly, and may be determined to be in an on-state when a level of the applied control gate voltage ($V_{CG}$) is lower than the latch-up voltage.

When the channel region under the first and second programming gate electrodes operates in the second channel mode, when a level of the applied control voltage ($V_{CG}$) is lower than the latch-up voltage, each of the triple-gate silicon devices may have a lowered potential barrier height between the channel region under the control gate electrode and the channel region under the first programming gate electrode adjacent to the drain region and may become the on-state, where current flows due to a second positive feedback loop in which holes are injected from the drain region due to the lowered potential barrier.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
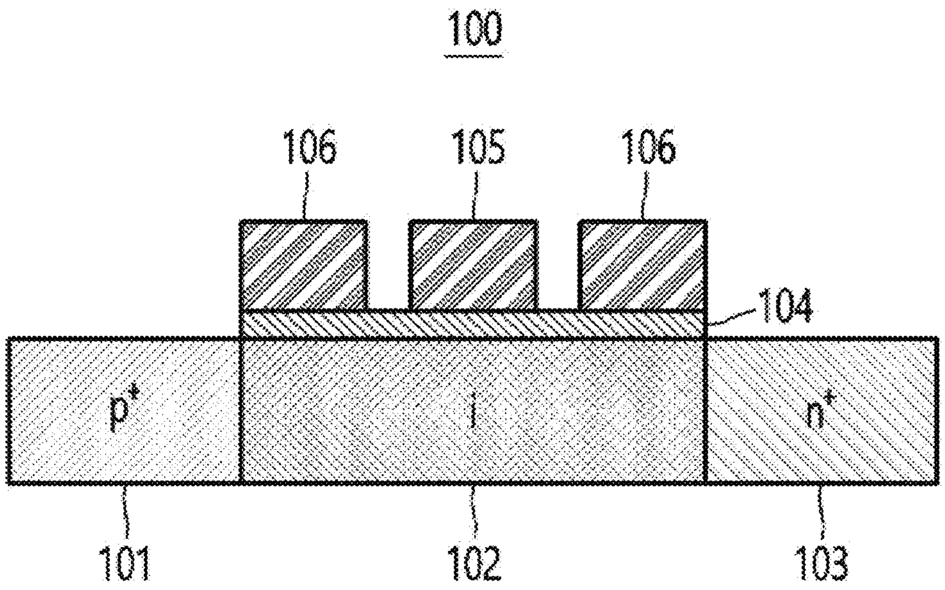
FIGS. 1A and 1B are diagrams illustrating a triple-gate silicon device constituting a universal logic memory cell according to one embodiment of the present disclosure.

Hereinafter, various embodiments of this document are described with reference to the attached diagrams.

However, it should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), the first element may be directly connected to the second element or may be connected to the second element via an intervening element (e.g., third).

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

Figure 1B:
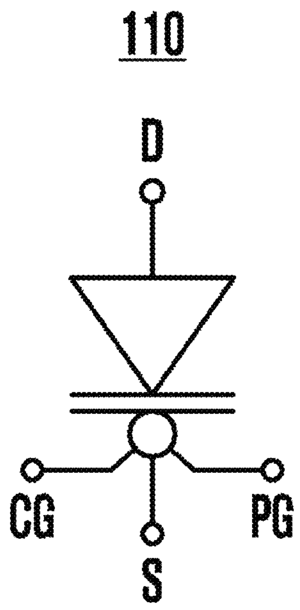

FIGS. 1A and 1B are diagrams illustrating a triple-gate silicon device constituting a universal logic memory cell according to one embodiment of the present disclosure.

FIG. 1A illustrates the structure of a triple-gate silicon device constituting a universal logic memory cell according to one embodiment of the present disclosure.

Referring to FIG. 1A, a triple-gate silicon device 100 according to one embodiment of the present disclosure includes a drain region 101, a channel region 102, a source region 103, and a gate region, and the gate region includes first and second programming gate electrodes 106 and a control gate electrode 105 formed on a gate insulating film 104.

For example, a drain electrode may be connected to the drain region 101 to apply a drain voltage, and a source electrode may be connected to the source region 103 to apply a source voltage.

According to one embodiment of the present disclosure, the triple-gate silicon device 100 includes the drain region 101, the channel region 102, and the source region 103, which are p-i-n nanostructures.

For example, the drain region 101 may be in a p-doped state, the source region 103 may be in an n-doped state, and the channel region 102 may be in an intrinsic state.

In the channel region 102, the channel region under the first and second programming gate electrodes 106 may operate as an n-channel corresponding to a first channel mode when the level of a program voltage ($V_{PG}$) is a positive level and may operate as a p-channel corresponding to a second channel mode when the level of a program voltage ($V_{PG}$) is a negative level.

The triple-gate silicon device 100 may be configured in multiple units to form a universal logic memory cell.

That is, the triple-gate silicon device 100 is composed of a plurality of units to form a universal logic memory cell, and some of the plurality of units may be configured as a first network device, and others may be configured as a second network device.

In the triple-gate silicon device 100, depending on the level of a program voltage ($V_{PG}$) applied through the first and second programming gate electrodes 106, the channel region under the first and second programming gate electrodes 106 may operate in one of a first channel mode and a second channel mode.

In addition, depending on the level of a control voltage ($V_{CG}$) applied through the control gate electrode, the triple-gate silicon device 100 may be determined to be in any one of an on-state and an off-state.

Accordingly, the universal logic memory cell may perform a logic operation function and a memory function based on the level of an output voltage ($V_{OUT}$) that changes depending on any one state in a previously performed channel mode.

That is, as the first network device and the second network device determine the level of an output voltage ($V_{OUT}$) as any one of a positive level, a zero level, and a negative level depending on any one state in a previously performed channel mode, a ternary logic operation function and a memory function may be performed.

For example, the first and second programming gate electrodes 106 are electrically connected so that the same program voltage ($V_{PG}$) may be applied at one time.

FIG. 1B illustrates circuit symbols associated with the operating states of a universal logic memory cell according to one embodiment of the present disclosure.

Referring to FIG. 1B, a circuit symbol 111 according to one embodiment of the present disclosure illustrates a case where the channel region of the triple-gate silicon device operates in a first channel mode and operates as an n-channel.

For example, a circuit symbol 110 illustrates a case where the channel region of the triple-gate silicon device operates in a second channel mode and operates as a p-channel.

The circuit symbol 110 and the circuit symbol 111 show a structure in which, in a nanostructure including a drain region, a channel region, a source region, and a gate region, the first and second programming gate electrodes and the control gate electrode are formed in the gate region and connected to a programming gate terminal (PG) and a control gate terminal (CG), a drain electrode is formed in the drain region and connected to a drain terminal (D), and a source electrode is formed in the source region and connected to a source terminal(S).

The circuit symbol 111 indicates that the triple-gate silicon device is in a first channel mode through a channel mode state region.

That is, the circuit symbol 111 may represent a channel mode state region in solid form, indicating that the triple-gate silicon device is operating as an n-channel.

The circuit symbol 110 indicates that the triple-gate silicon device is in a second channel mode state through a channel mode state region.

The circuit symbol 110 may represent the channel mode state region as empty, indicating that the triple-gate silicon device is operating in a p-channel mode.

For example, the triple-gate silicon device may be referred to as a triple-gate feedback field-effect device.

Figure 2A:
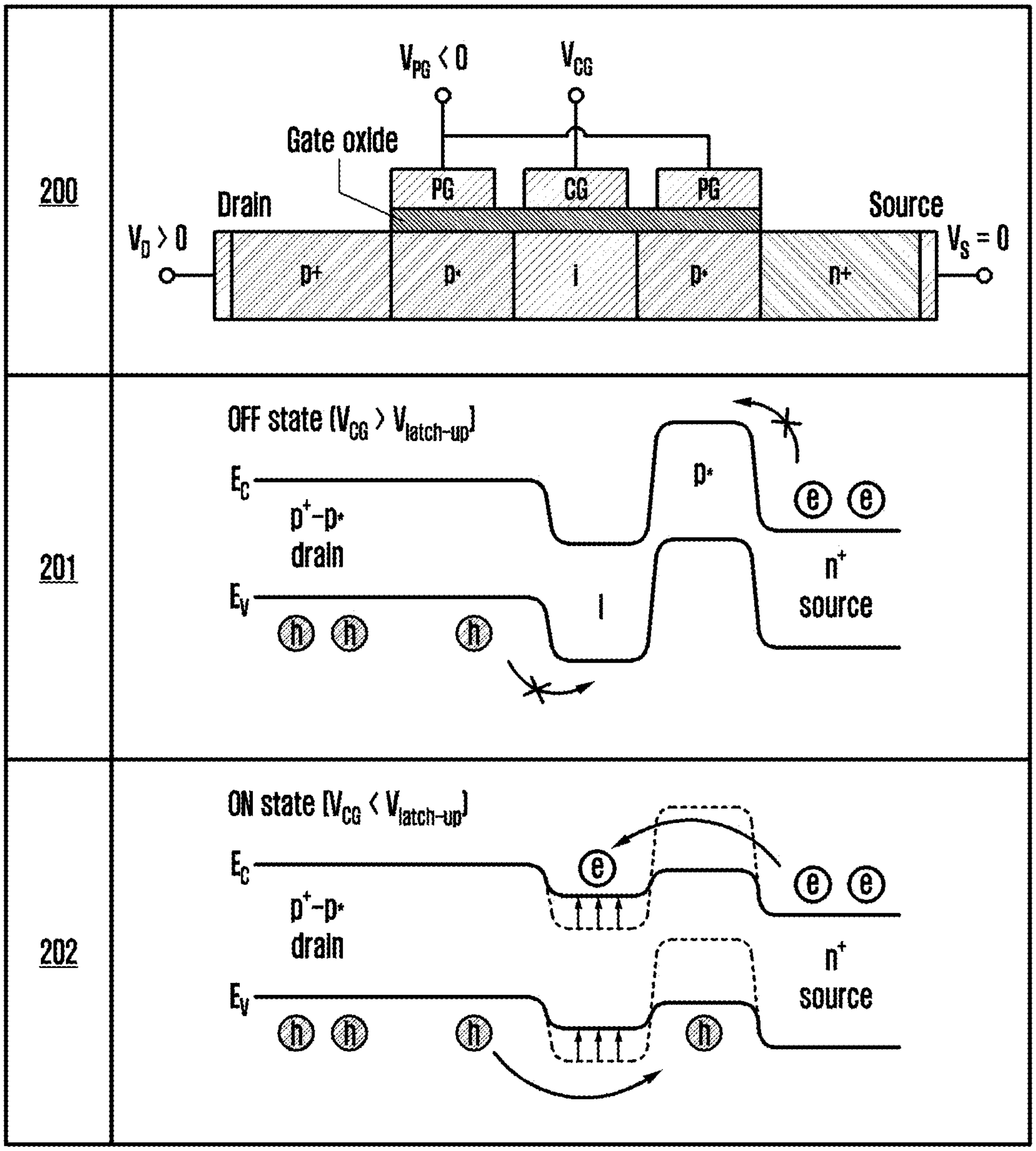
FIGS. 2A to 2C are diagrams illustrating the operating principle of a triple-gate silicon device according to one embodiment of the present disclosure.
Figure 2B:
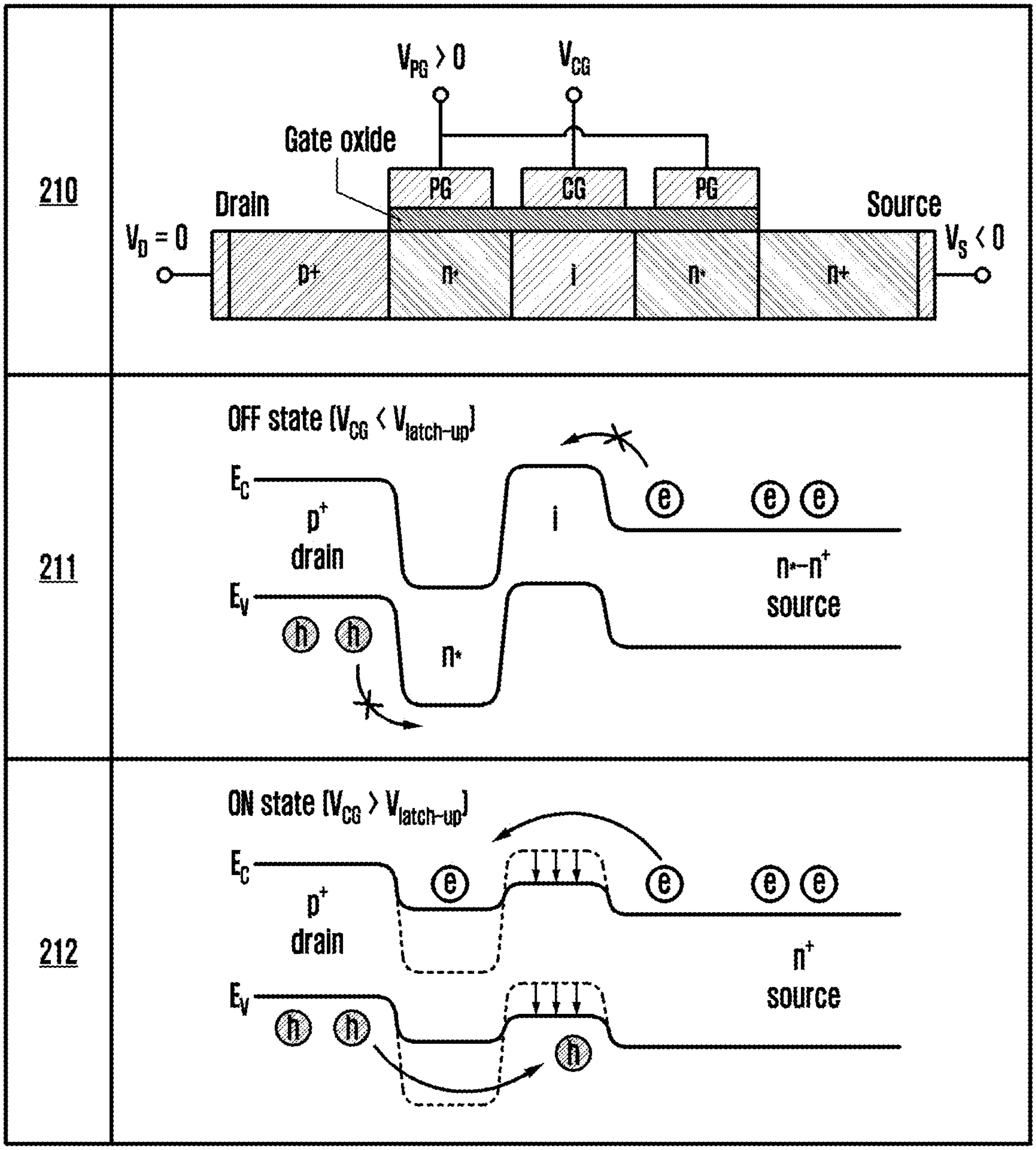
Figure 2C:
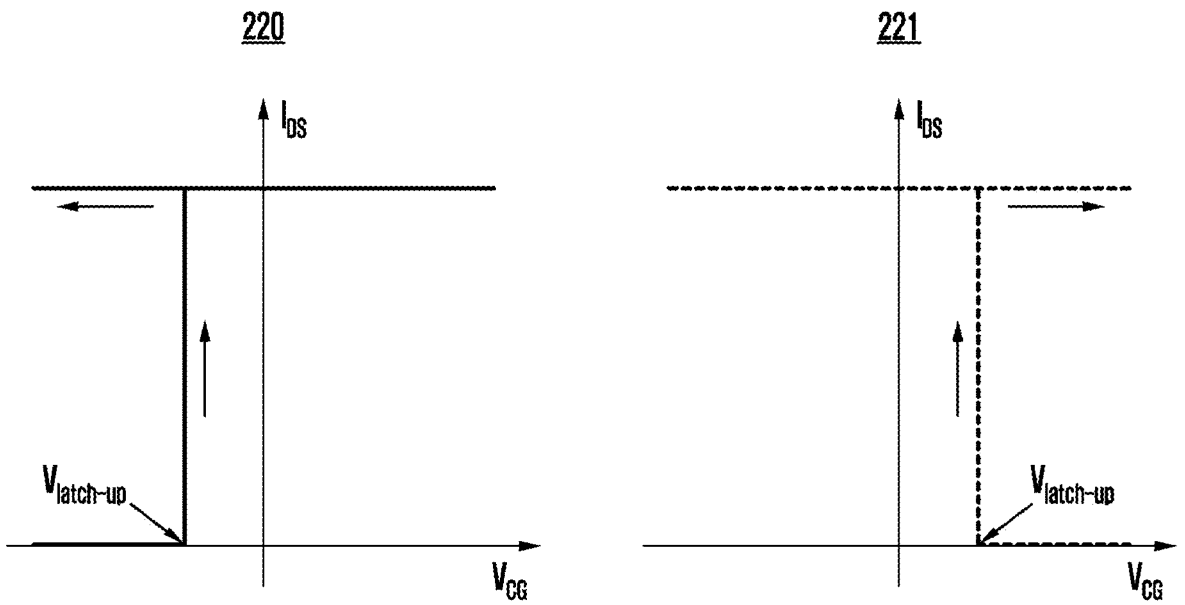

FIGS. 2A to 2C are diagrams illustrating the operating principle of a triple-gate silicon device according to one embodiment of the present disclosure.

FIG. 2A illustrates the operating principle when the triple-gate silicon device according to one embodiment of the present disclosure operates as a p-channel.

Referring to FIG. 2A, when a positive voltage is applied through the drain terminal and a negative voltage corresponding to the level of a program voltage is applied to the programming gate terminal, a triple-gate silicon device 200 according to one embodiment of) the present disclosure operates as a p-channel because the channel region under the programming gate electrode (PG) is programmed as a p-channel.

When the triple-gate silicon device 200 according to one embodiment of the present disclosure operates as a p-channel, the operation state is determined to be in an off-state when the level of a control voltage applied through the control gate terminal is higher than a latch-up voltage, which is a voltage at which current increases rapidly, and is determined to be in an on-state when the level of the applied control voltage is lower than the latch-up voltage.

For example, a triple-gate silicon device is determined to be in an on-state or off-state based on the level of a control voltage applied through the control gate terminal.

The on and off operation states of the triple-gate silicon device may be further described through an energy band 201 corresponding to the off-state and an energy band 202 corresponding to the on-state.

When the triple-gate silicon device according to one embodiment of the present disclosure operates as a p-channel, based on the level of a control voltage, the on-state corresponds to the energy band 202, and the off-state corresponds to the energy band 201.

According to the energy band 201 and the energy band 202, when the channel region under the first and second programming gate electrodes operates in a second channel mode corresponding to a p-channel mode, when the level of a control voltage ($V_{CG}$) is lower than a latch-up voltage, the height of the potential barrier between the channel region under the control gate electrode and the channel region under the first programming gate electrode adjacent to the drain region is lowered, and a second positive feedback loop occurs in which holes are injected from the drain region due to the lowered potential barrier, resulting in an on-state in which current flows.

That is, the triple-gate silicon device may switch from the energy band 201 to the energy band 202 by inducing a second positive feedback loop.

It can be confirmed that the positive feedback loop occurs as charge injection and accumulation are repeated, and the state is switched to the on-state where current flows.

For example, the second positive feedback loop may be a positive feedback loop in which holes in the channel region become the majority carriers.

FIG. 2B illustrates the operating principle when the triple-gate silicon device according to one embodiment of the present disclosure operates in an n-channel mode.

Referring to FIG. 2B, when a negative voltage is applied through the source terminal and a positive voltage corresponding to a positive level of the program voltage is applied to the programming gate terminal, a triple-gate silicon device 210 according to one embodiment of the present disclosure operates as an n-channel because the channel region under the programming gate electrode (PG) is programmed as an n-channel.

For example, a triple-gate silicon device is determined to be in an on-state or off-state based on the level of a control voltage applied through the control gate terminal.

When the triple-gate silicon device 210 according to one embodiment of the present disclosure operates as an n-channel, the operation state may be determined to be in an on-state when the level of a control voltage applied through the control gate terminal is higher than a latch-up voltage, which is a voltage at which current increases rapidly, and may be determined to be in an off-state when the level of the applied control gate voltage ($V_{CG}$) is lower than the latch-up voltage.

When the triple-gate silicon device according to one embodiment of the present disclosure operates as an n-channel, an energy band 211 corresponding to an off-state based on the level of a control voltage and an energy band 212 corresponding to an on-state are shown.

Referring to the energy band 211 and the energy band 212, when the channel region under the first and second programming gate electrodes operates in a first channel mode corresponding to an n-channel mode, when the level of a control voltage ($V_{CG}$) is higher than the latch-up voltage, the height of the potential barrier between the channel region under the control gate electrode and the channel region under the second programming gate electrode adjacent to the source region is lowered, and a first positive feedback loop occurs in which electrons are injected from the source region due to the lowered potential barrier, resulting in an on-state in which current flows.

That is, the triple-gate silicon device has a first positive feedback loop that switches from the energy band 211 to the energy band 212.

It can be confirmed that the positive feedback loop occurs as charge injection and accumulation are repeated, and the state is switched to the on-state where current flows.

For example, the first positive feedback loop may be a positive feedback loop in which electrons are the majority carriers in the channel region.

FIG. 2C illustrates the operation associated with the first and second positive feedback loops when the triple-gate silicon device according to one embodiment of the present disclosure operates as an n-channel and a p-channel.

Referring to FIG. 2C, a graph 220 shows the operating characteristics of the n-channel mode of a triple-gate silicon device, and a graph 221 shows the operating characteristics of the p-channel mode of a triple-gate silicon device.

The graph 220 shows that, when the triple-gate silicon device operating in an n-channel mode has an on-state and an off-state depending on a voltage applied to the control gate electrode, when a control gate voltage is smaller than a latch-up voltage, which is a voltage at which current increases rapidly, the flow of electrons and holes is blocked by a potential barrier, resulting in an off-state and an increase in the control gate voltage. As the control gate voltage increases above the latch-up voltage, electrons in the source region are injected into the channel over the potential barrier and accumulate in the potential well adjacent to the drain region, lowering the potential barrier height.

Accordingly, holes in the drain region are injected into the channel and accumulated in the potential well adjacent to the source region, lowering the potential barrier height.

Charge injection and accumulation are repeated to create a positive feedback loop, which results in an on-state where current flows.

The graph 221 shows that, in the case of the triple-gate silicon device operating in an p-channel mode, when the control gate voltage is greater than the latch-up voltage, the flow of electrons and holes is blocked by the potential barrier, resulting in an off-state and a decrease in the control gate voltage. When the control gate voltage is lower than the latch-up voltage, holes in the drain region are injected into the channel over the potential barrier and accumulate in the potential well adjacent to the source region, lowering the potential barrier height.

According to one embodiment of the present disclosure, the triple-gate silicon device may be a device in which a first positive feedback loop or a second positive feedback loop is formed depending on the level of a control voltage applied to the gate region, and in which an on or off state is variably controlled in a first channel mode and a second channel mode. Here, the first channel mode is an n-channel mode, and the second channel mode is a p-channel mode.

In addition, the triple-gate silicon device is turned on by forming a positive feedback loop as charge carriers accumulate in the potential well of the channel region, which may be utilized as a memory function to retain data in the channel region.

Accordingly, the present disclosure may implement a universal logic memory cell using a triple-gate silicon device, which is a silicon-based feedback memory device using a conventional CMOS process.

Figure 3:
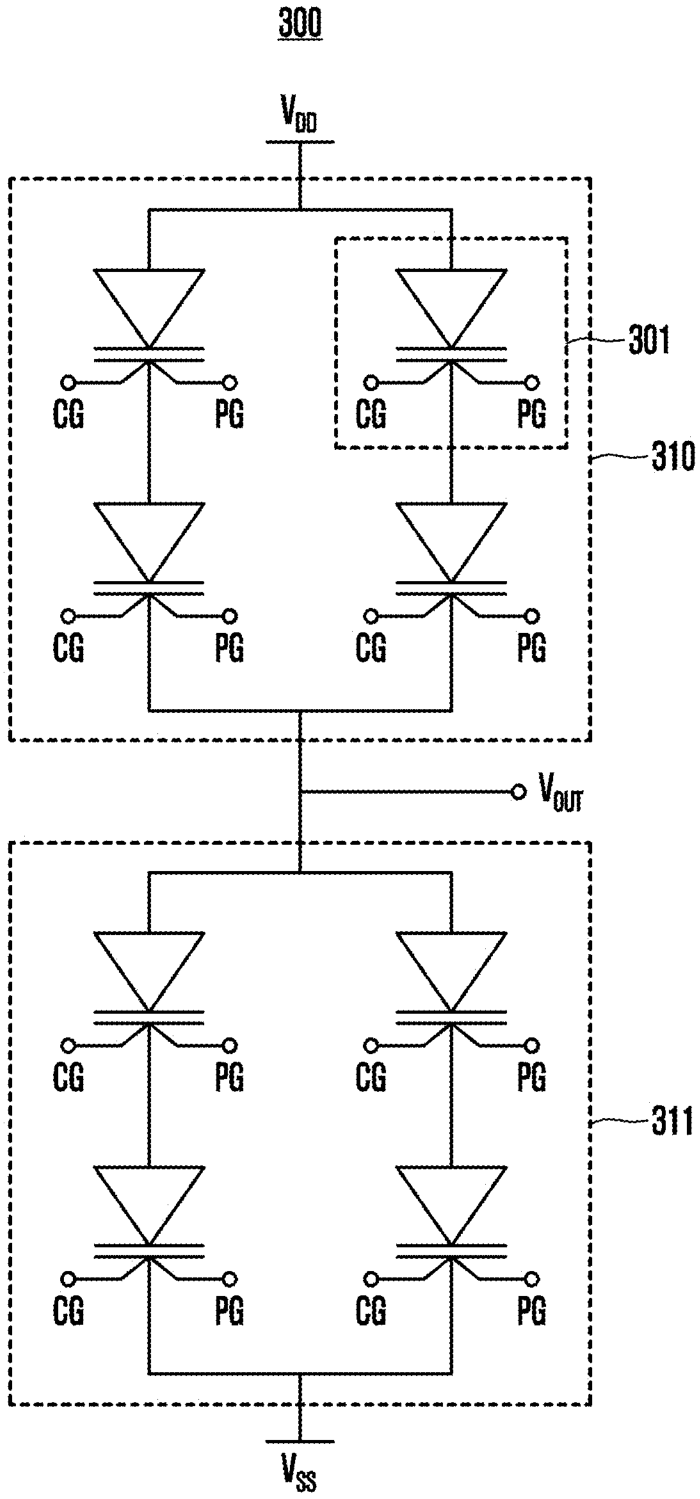
FIG. 3 is a diagram illustrating a universal logic memory cell according to one embodiment of the present disclosure.

FIG. 3 is a diagram illustrating a universal logic memory cell according to one embodiment of the present disclosure.

FIG. 3 illustrates a circuit diagram of a universal logic memory cell including a first network device and a second network device using a plurality of triple-gate silicon devices according to one embodiment of the present disclosure.

Referring to FIG. 3, a universal logic memory cell 300 according to one embodiment of the present disclosure consists of a first network device 310 and a second network device 311, and the first network device 310 and the second network device 311 consist of a plurality of triple-gate silicon devices 301.

More specifically, the first network device 310 and the second network device 311 consist of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween.

The first network device 310 may be referred to as a pull-up network device, and the second network device 311 may be referred to as a pull-down network device.

According to one embodiment of the present disclosure, the universal logic memory cell 300 may perform a ternary logic operation function and a memory function.

For example, based on the inputs of a positive level, a zero level, and a negative level, the universal logic memory cell 300 performs a ternary logical operation as the outputs of a positive level, a zero level, and a negative level, and performs a memory function of maintaining the state of a preset voltage by controlling a supply voltage, a voltage corresponding to a voltage applied to a program gate electrode, an input voltage applied to a control gate electrode to "0".

According to one embodiment of the present disclosure, the first network device 310 and the second network device 311 each include four triple-gate silicon devices, which may be referred to as two triple-gate silicon devices separated by an upper side, a lower side, a left side, and a right side, or as one triple-gate silicon device separated by an upper left side, an upper right side, a lower left side, and a lower right side.

The triple-gate silicon devices arranged at each location may be selectively driven in either a first channel mode or a second channel mode.

The above-described configuration may be changed depending on the arrangement of network devices, and may be designated in a modified manner depending on the changed connection configuration.

The first network device 310 receives a drain voltage ($V_{DD}$) of a common voltage through the first parallel connection of the first network device 310.

The second network device 311 receives a source voltage ($V_{SS}$) of a common voltage through the second parallel connection of the second network device 311.

In the universal logic memory cell 300 according to one embodiment of the present disclosure, an output voltage ($V_{OUT}$) may be measured at the point where the second parallel connection of the first network device 310 and the first parallel connection of the second network device 311 are connected.

The universal logic memory cell 300 is composed of the first network device 310 and the second network device 311, and implements logical operations based on the measurements of a drain voltage ($V_{DD}$) and a source voltage ($V_{SS}$) at an output voltage ($V_{OUT}$) depending on the operation state of the triple-gate silicon device 301.

The universal logic memory cell 300 according to one embodiment of the present disclosure uses a plurality of triple-gate silicon devices.

Each of the triple-gate silicon devices includes a drain region, a channel region, and a source region, and a supply voltage is applied to the drain region and the source region. Each of the triple-gate silicon devices includes a gate region in which first and second programming gate electrodes and a control gate electrode are formed on the channel region.

In addition, in each of the triple-gate silicon devices, depending on the level of a program voltage ($V_{PG}$) applied through the first and second programming gate electrodes, the channel region under the first and second programming gate electrodes may operate in one of a first channel mode and a second channel mode, and depending on the level of a control voltage ($V_{CG}$) applied through the control gate electrode, the channel region may be determined to be in any one of an on-state and an off-state.

The first network device 310 and the second network device 311 may perform a ternary logic operation function and a memory function by determining the level of an output voltage ($V_{OUT}$) as one of a positive level, a zero level, and a negative level depending on a predetermined any one state in a previously performed channel mode.

The ternary logic operation function is a logic operation function related to TNOT, TYES, NAND, NOR, AND, TOR, TXNOR, and TXOR gates.

Accordingly, the present disclosure may implement a universal logic memory cell that provides ternary logic operation function and memory function using a triple-gate silicon device driven by a positive feedback loop.

In addition, the present disclosure may implement a universal logic memory cell that performs all ternary basic logic operations in a single structure using a triple-gate silicon device and stores the results of the operations.

Figure 4A:
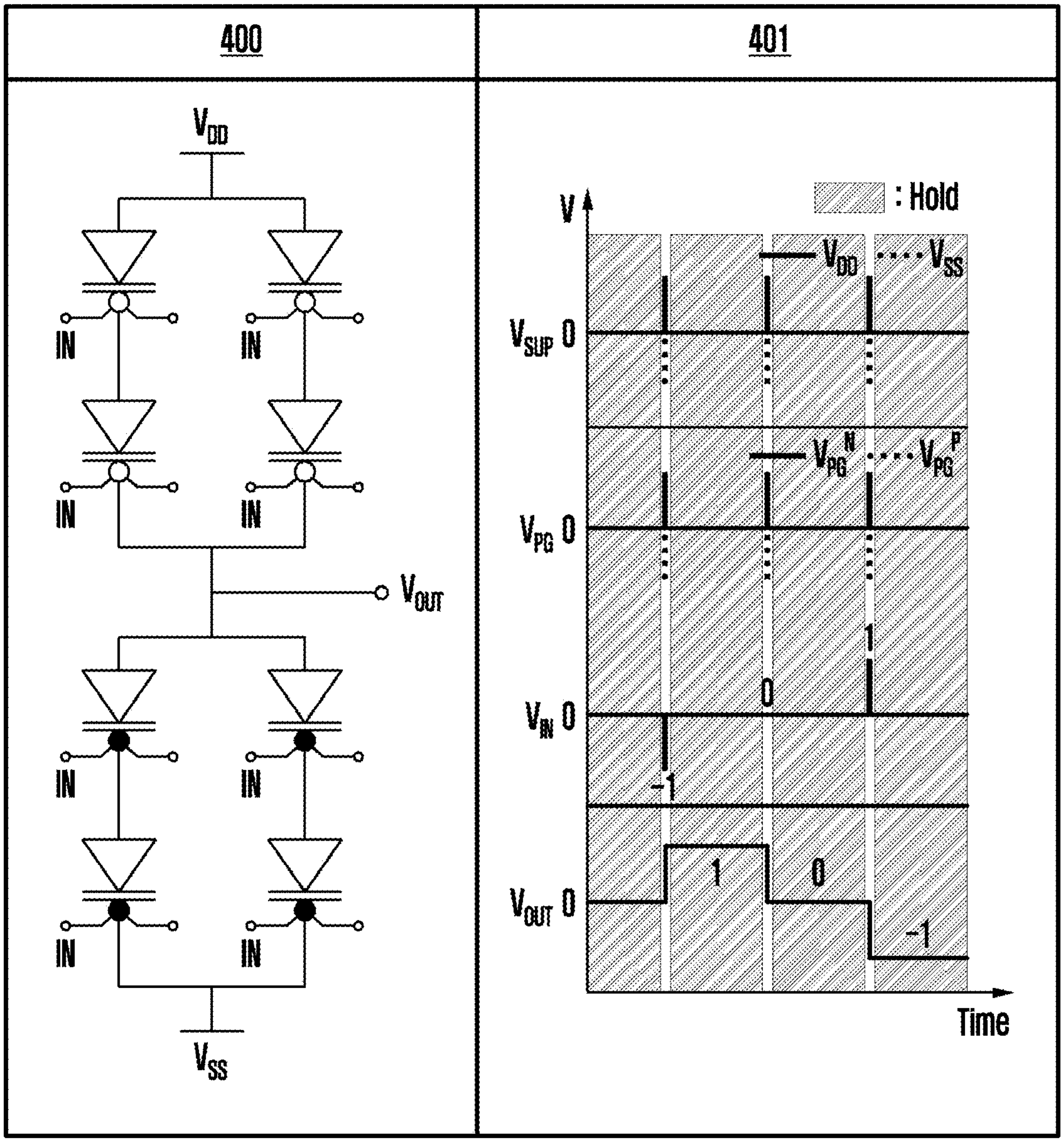
FIG. 4A is a diagram illustrating the TNOT gate operation of a universal logic memory cell according to one embodiment of the present disclosure.

FIG. 4A is a diagram illustrating the TNOT gate operation of a universal logic memory cell according to one embodiment of the present disclosure.

FIG. 4A illustrates a circuit diagram and timing diagram for a TNOT gate operation of the universal logic memory cell according to one embodiment of the present disclosure.

Referring to FIG. 4A, in a universal logic memory cell 400 according to one embodiment of the present disclosure, triple-gate silicon devices constituting a first network device operate in a second channel mode based on a programming voltage applied through a programming gate terminal (PG), and triple-gate silicon devices constituting a second network device operate in a first channel mode.

At this time, in the universal logic memory cell 400, when the level of the control voltage ($V_{CG}$), which is the input voltage (IN) applied through the control gate terminal (CG), is a negative level, the level of the output voltage ($V_{OUT}$) measured through the output terminal is a positive level. When the level of the control voltage ($V_{CG}$) is a positive level, a logic operation function corresponding to the TNOT gate operation may be performed when the level of the output voltage ($V_{OUT}$) is a negative level.

In addition, when the level of the control voltage ($V_{CG}$) is a zero level, the universal logic memory cell 400 may perform a logic operation function corresponding to a TNOT gate operation in which the level of the output voltage ($V_{OUT}$) is determined to be a zero level.

The timing diagram 401 illustrates that when an input voltage ($V_{IN}$) of a negative level corresponding to "−1" is applied, an output voltage ($V_{OUT}$) of a positive level corresponding to "1" is logically operated and output.

In addition, the timing diagram 401 illustrates that when an input voltage ($V_{IN}$) of a positive level corresponding to "1" is applied, an output voltage ($V_{OUT}$) of a negative level corresponding to "−1" is logically operated and output.

In addition, the timing diagram 401 illustrates that when an input voltage ($V_{IN}$) of a zero level corresponding to "0" is applied, an output voltage ($V_{OUT}$) of a zero level corresponding to "0" is logically operated and output.

In addition, a memory function of holding the calculated logic value is performed even when a supply voltage ($V_{SUP}$), a program voltage ($V_{PG}$), and an input voltage ($V_{IN}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 4B:
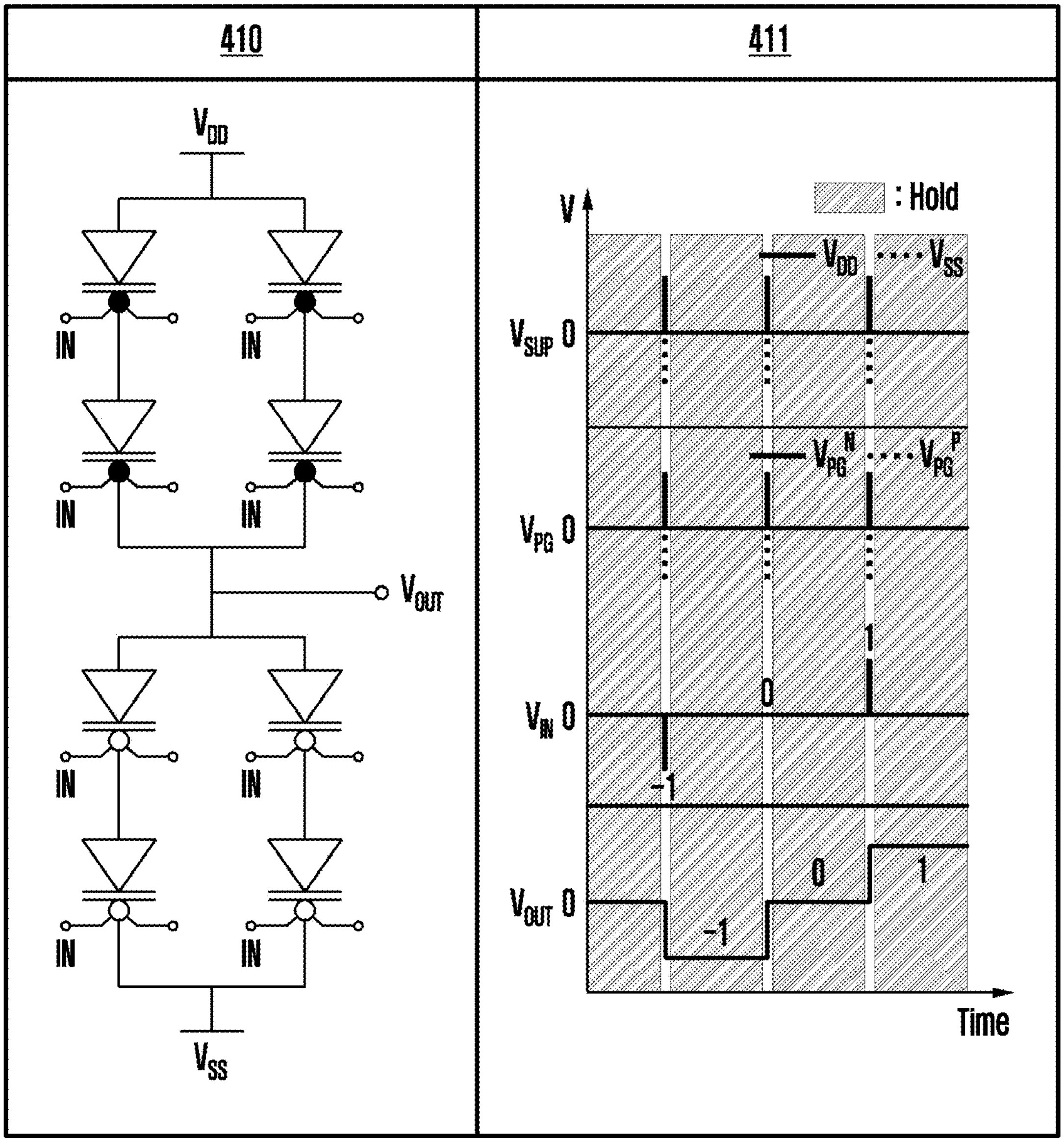
FIG. 4B is a diagram illustrating the TYES gate operation of a universal logic memory cell according to one embodiment of the present disclosure.

FIG. 4B is a diagram illustrating the TYES gate operation of a universal logic memory cell according to one embodiment of the present disclosure.

FIG. 4B illustrates a circuit diagram and timing diagram for the TYES gate operation of the universal logic memory cell according to one embodiment of the present disclosure.

Referring to FIG. 4B, in a universal logic memory cell 410 according to one embodiment of the present disclosure, based on a programming voltage applied through a programming gate terminal (PG), triple-gate silicon devices constituting a first network device operate in a first channel mode, and triple-gate silicon devices constituting a second network device operate in a second channel mode.

At this time, in the universal logic memory cell 410, when the level of a control voltage ($V_{CG}$), which is an input voltage (IN) applied through a control gate terminal (CG), is a positive level, the level of an output voltage ($V_{OUT}$) measured through an output terminal may be a positive level. When the level of a control voltage ($V_{CG}$) is a negative level, the level of an output voltage ($V_{OUT}$) may be a negative level, and a logic operation function corresponding to a TYES gate operation may be performed.

In addition, when the level of a control voltage ($V_{CG}$) is a zero level, the universal logic memory cell 410 may perform a logic operation function corresponding to a TYES gate operation, which determines the level of an output voltage ($V_{OUT}$) as a zero level.

The timing diagram 411 illustrates that when an input voltage ($V_{IN}$) of a negative level corresponding to "−1" is applied, an output voltage ($V_{OUT}$) of a negative level corresponding to "−1" is logically operated and output.

In addition, the timing diagram 411 illustrates that when an input voltage ($V_{IN}$) of a positive level corresponding to "1" is applied, an output voltage ($V_{OUT}$) of a positive level corresponding to "1" is logically operated and output.

In addition, the timing diagram 411 illustrates that when an input voltage ($V_{IN}$) of a zero level corresponding to "0" is applied, an output voltage ($V_{OUT}$) of a zero level corresponding to "0" is logically operated and output.

In addition, a memory function of holding the calculated logic value is performed even when a supply voltage ($V_{SUP}$), a program voltage ($V_{PG}$), and an input voltage ($V_{IN}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 5A:
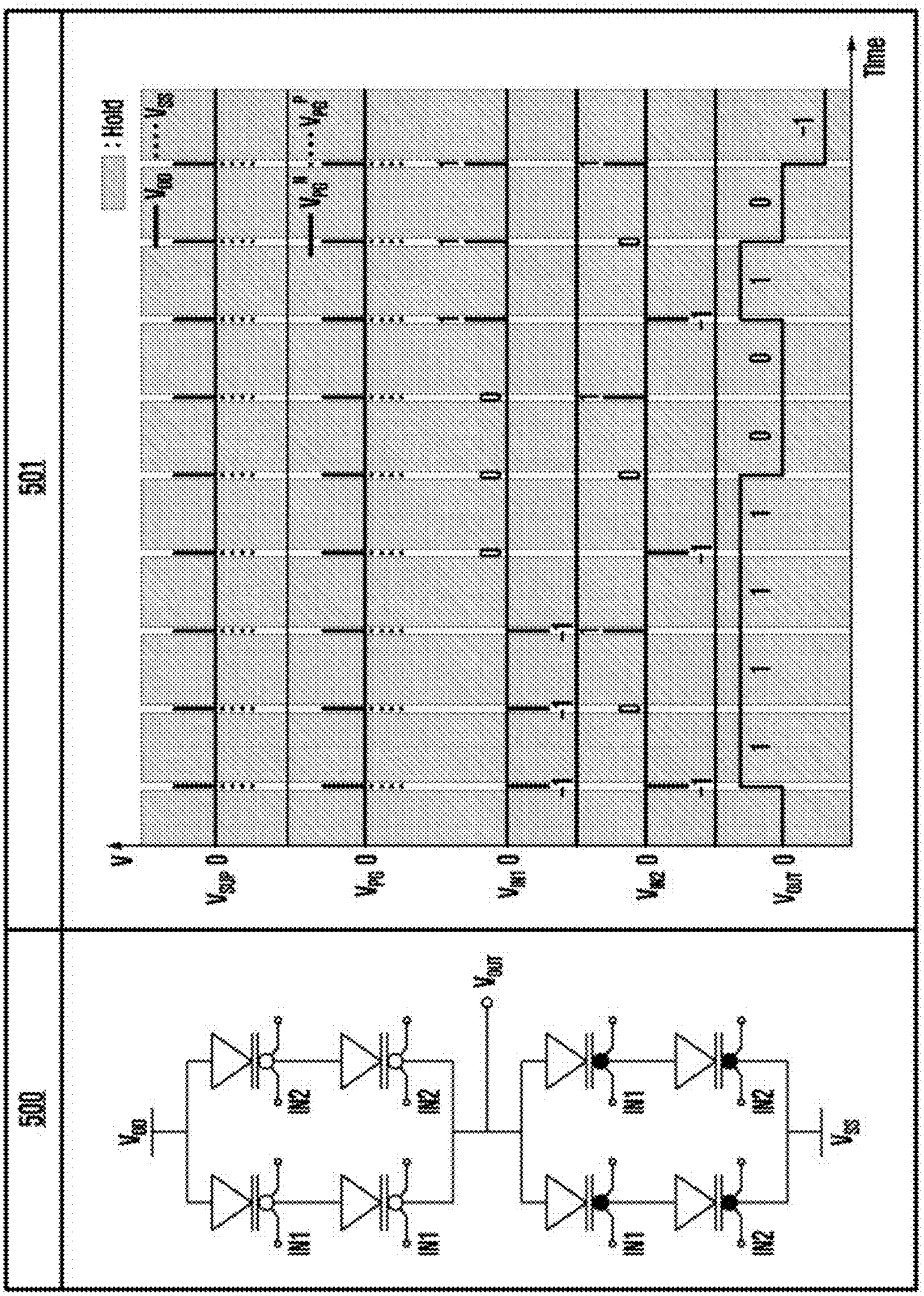
FIG. 5A is a diagram illustrating the TNAND gate operation of a universal logic memory cell according to one embodiment of the present disclosure.

FIG. 5A is a diagram illustrating the TNAND gate operation of a universal logic memory cell according to one embodiment of the present disclosure.

FIG. 5A illustrates a circuit diagram and timing diagram for the TNAND gate operation of the universal logic memory cell according to one embodiment of the present disclosure.

Referring to FIG. 5A, in the universal logic memory cell 500 according to one embodiment of the present disclosure, based on a programming voltage applied through the programming gate terminal (PG), the triple-gate silicon devices constituting the first network device operate in a second channel mode, and the triple-gate silicon devices constituting the second network device operate in a first channel mode.

In addition, in the universal logic memory cell 500, a first control voltage (IN1) of a control voltage ($V_{CG}$) is applied to the left side of the first network device and the upper side of the second network device, and a second control voltage (IN2) of a control voltage ($V_{CG}$) is applied to the right side of the first network device and the lower side of the second network device.

Accordingly, in the universal logic memory cell 500, when any one of the levels of a first control voltage (IN1) and a second control voltage (IN2) is a negative level, the level of an output voltage ($V_{OUT}$) is determined as a positive level.

In addition, when the levels of a first control voltage (IN1) and a second control voltage (IN2) are both positive levels, the universal logic memory cell 500 may perform a logic operation function of a TNAND gate that determines the level of an output voltage ($V_{OUT}$) as a negative level.

In addition, when the levels of a first control voltage (IN1) and a second control voltage (IN2) are both zero levels or any one level is a zero level and the other level is a positive level, the universal logic memory cell 500 may perform a ternary logic operation function by performing the logic operation function of a TNAND gate that determines the level of the output voltage ($V_{OUT}$) as a zero level.

The timing diagram 501 shows that when an input corresponding to a combination of "−1", "0", and "1" is applied to two input voltages ($V_{IN1}$, $V_{IN2}$), a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 5B:
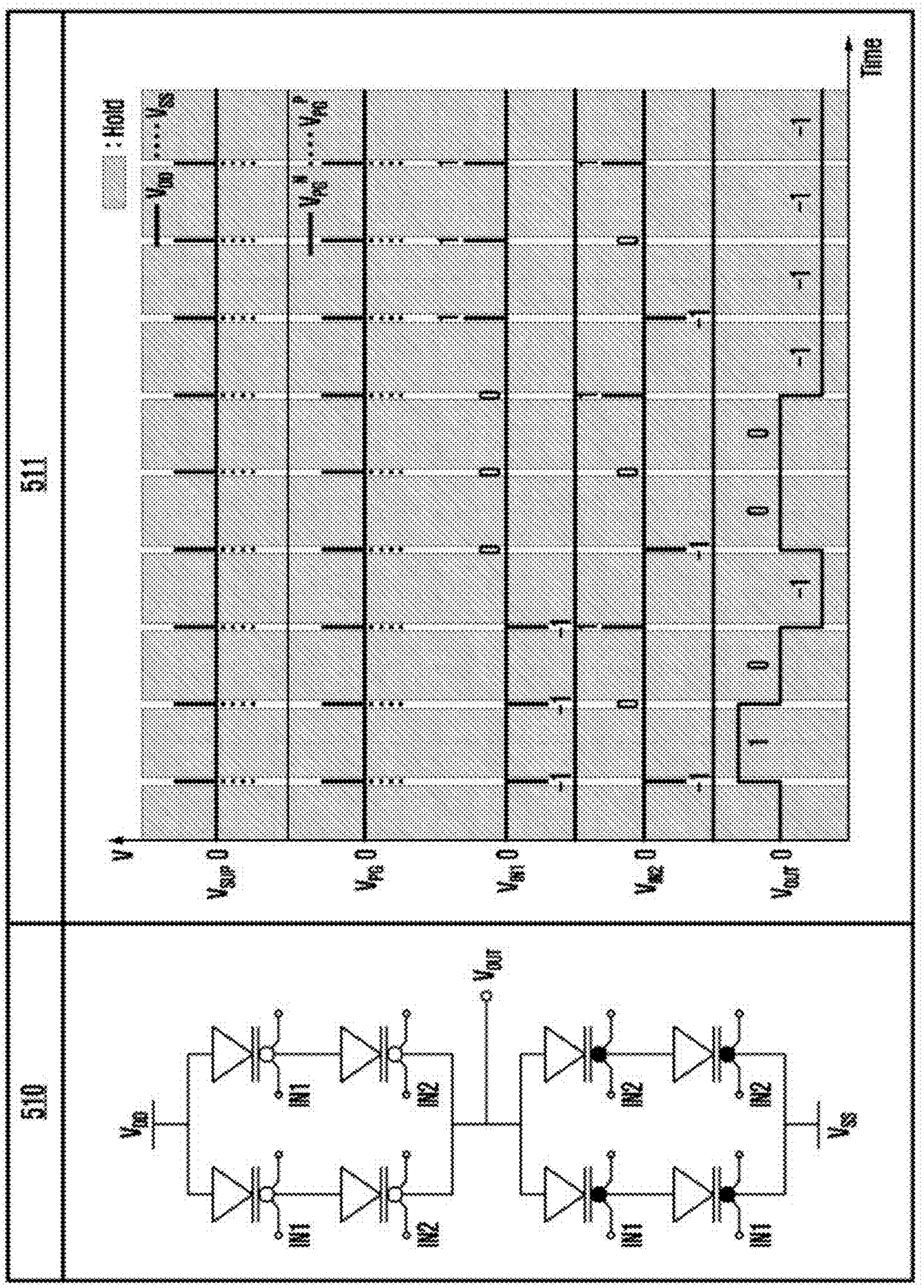
FIG. 5B is a diagram illustrating the TNOR gate operation of a universal logic memory cell according to one embodiment of the present disclosure.

FIG. 5B is a diagram illustrating the TNOR gate operation of a universal logic memory cell according to one embodiment of the present disclosure.

FIG. 5B illustrates a circuit diagram and timing diagram for a TNOR gate operation of the universal logic memory cell according to one embodiment of the present disclosure.

Referring to FIG. 5B, in a universal logic memory cell 510 according to one embodiment of the present disclosure, based on a programming voltage applied through the programming gate terminal (PG), the triple-gate silicon devices constituting the first network device operate in a second channel mode, and the triple-gate silicon devices constituting the second network device operate in a first channel mode.

In addition, in the universal logic memory cell 510, a first control voltage (IN1) of a control voltage ($V_{CG}$) is applied to the upper side of the first network device and the left side of the second network device, and a second control voltage (IN2) of a control voltage ($V_{CG}$) is applied to the lower side of the first network device and the right side of the second network device.

Accordingly, when any one of the levels of a first control voltage ($V_{IN1}$) and a second control voltage ($V_{IN2}$) is a positive level, the universal logic memory cell 510 determines the level of an output voltage ($V_{OUT}$) as a negative level.

In addition, when the levels of a first control voltage ($V_{IN1}$) and a second control voltage ($V_{IN2}$) are both negative levels, the universal logic memory cell 510 determines the level of an output voltage ($V_{OUT}$) as a positive level.

In addition, when the levels of a first control voltage ($V_{IN1}$) and a second control voltage ($V_{IN2}$) are both zero levels or any one level is a zero level and the other level is a negative level, the universal logic memory cell 510 performs a TNOR operation of ternary logic operation functions that determine the level of an output voltage ($V_{OUT}$) as a zero level.

The timing diagram 511 shows that when an input corresponding to a combination of "−1", "0", and "1" is applied to two input voltages ($V_{IN1}$, $V_{IN2}$), a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 6A:
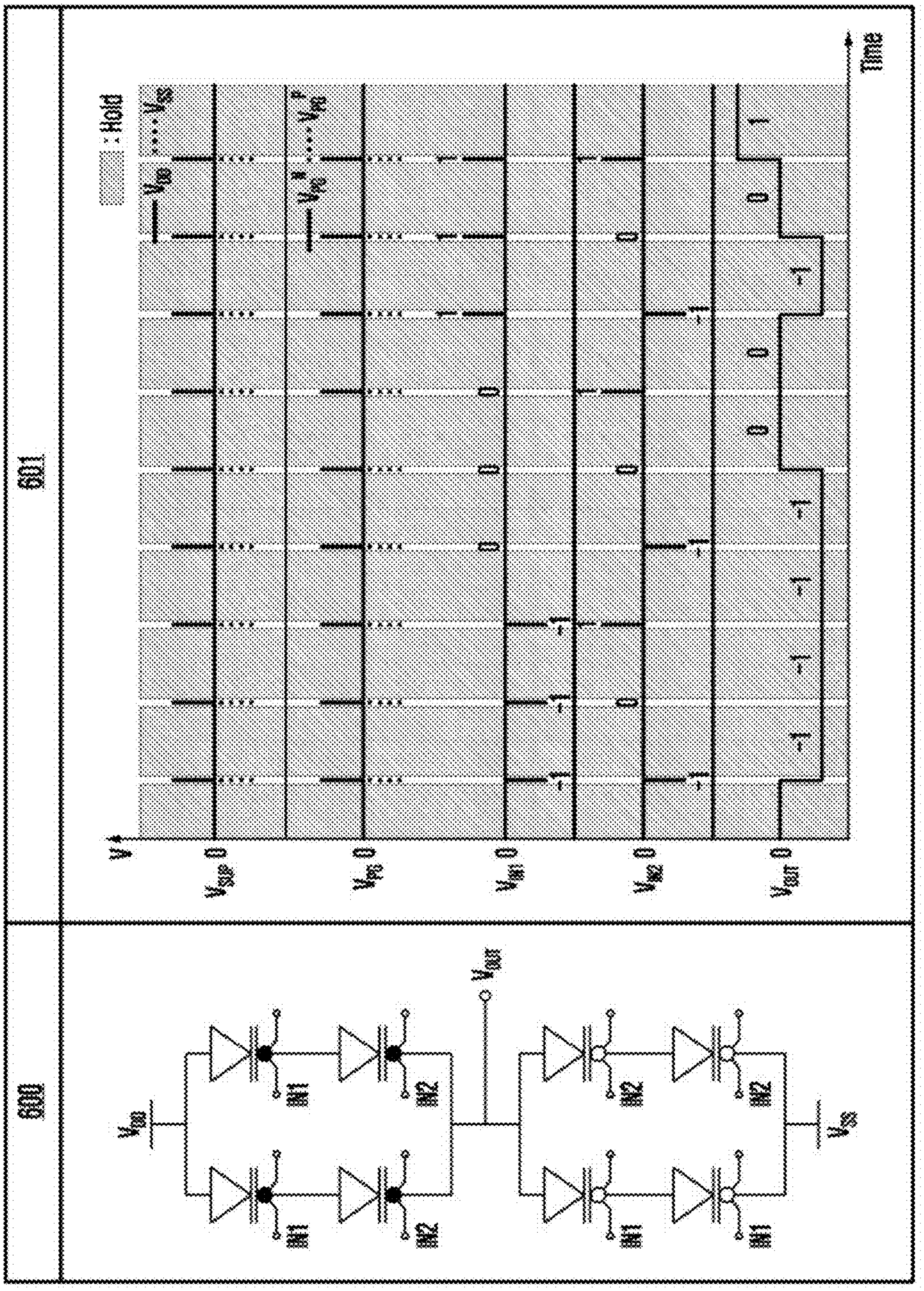
FIG. 6A is a diagram illustrating the TAND gate operation of a universal logic memory cell according to one embodiment of the present disclosure.

FIG. 6A is a diagram illustrating the TAND gate operation of a universal logic memory cell according to one embodiment of the present disclosure.

FIG. 6A illustrates a circuit diagram and timing diagram for a TAND gate operation of the universal logic memory cell according to one embodiment of the present disclosure.

Referring to FIG. 6A, in a universal logic memory cell 600 according to one embodiment of the present disclosure, based on a programming voltage applied through the programming gate terminal (PG), the triple-gate silicon devices constituting the first network device operate in a first channel mode, and the triple-gate silicon devices constituting the second network device operate in a second channel mode.

In addition, in the universal logic memory cell 600, a first control voltage (IN1) of a control voltage ($V_{CG}$) is applied to the upper side of the first network device and the left side of the second network device, and a second control voltage (IN2) of a control voltage ($V_{CG}$) is applied to the lower side of the first network device and the right side of the second network device.

Accordingly, when any one of the levels of a first control voltage ($V_{IN1}$) and a second control voltage ($V_{IN2}$) is a negative level, the universal logic memory cell 600 performs a logical operation of determining the level of an output voltage ($V_{OUT}$) as a negative level.

In addition, when the levels of a first control voltage ($V_{IN1}$) and a second control voltage ($V_{IN2}$) are both positive levels, the universal logic memory cell 600 determines the level of an output voltage ($V_{OUT}$) as a positive level.

In addition, when the levels of a first control voltage ($V_{IN1}$) and a second control voltage ($V_{IN2}$) are both zero levels or any one level is a zero level and the other level is a positive level, the universal logic memory cell 600 performs a ternary logic operation function of determining the level of an output voltage ($V_{OUT}$) as a zero level.

That is, the universal logic memory cell 600 performs a TAND gate operation.

The timing diagram 601 shows that when an input corresponding to a combination of "−1", "0", and "1" is applied to two input voltages ($V_{IN1}$, $V_{IN2}$), a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed. For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 6B:
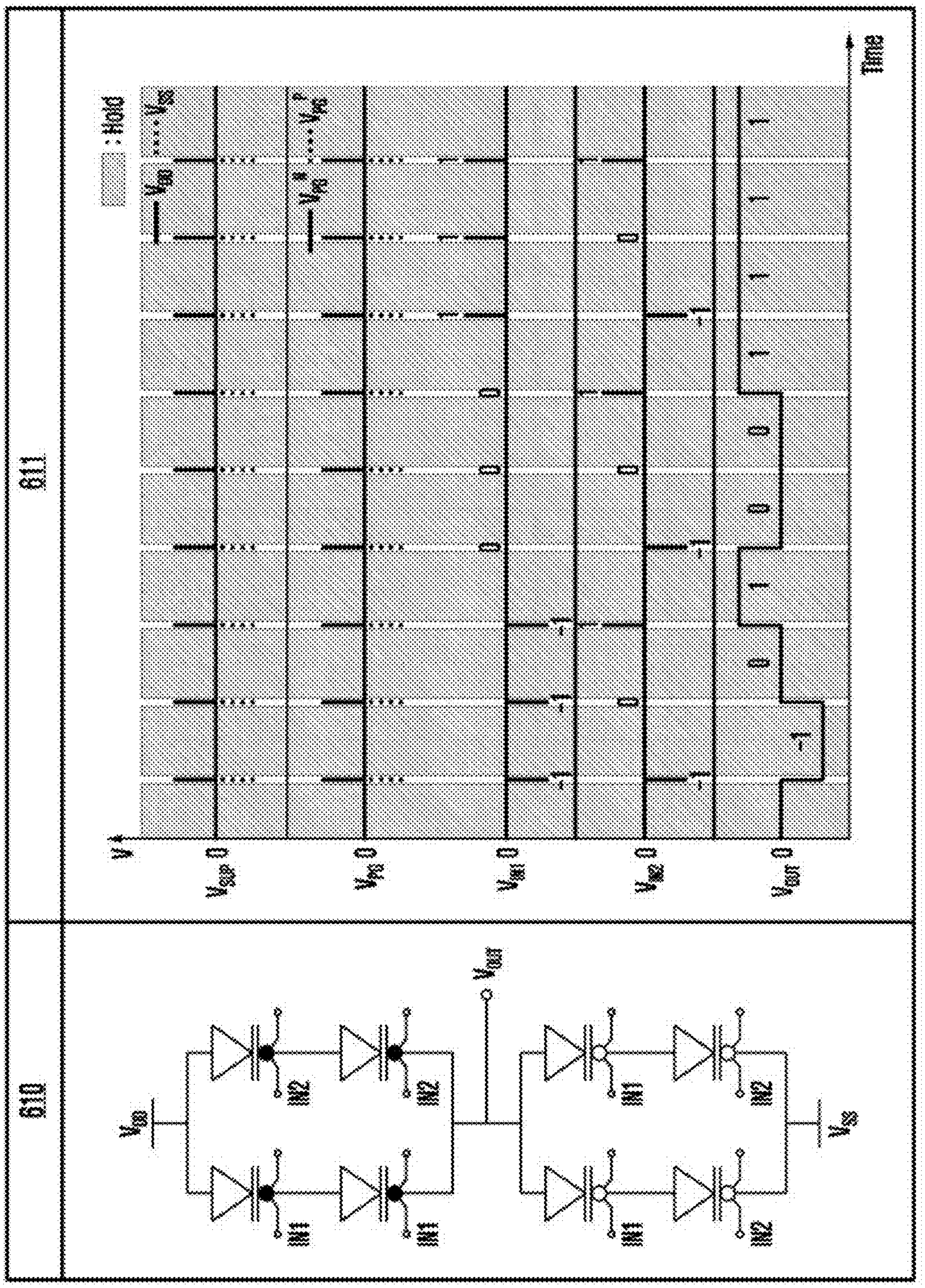
FIG. 6B is a diagram illustrating the TOR gate operation of a universal logic memory cell according to one embodiment of the present disclosure.

FIG. 6B is a diagram illustrating the TOR gate operation of a universal logic memory cell according to one embodiment of the present disclosure.

FIG. 6B illustrates a circuit diagram and timing diagram for a TOR gate operation of the universal logic memory cell according to one embodiment of the present disclosure.

Referring to FIG. 6B, in a universal logic memory cell 610 according to one embodiment of the present disclosure, based on a programming voltage applied through the device operate in a first channel mode, and the triple-gate silicon devices constituting the second network device operate in a second channel mode.

In addition, in the universal logic memory cell 610, a first control voltage (IN1) of a control voltage ($V_{CG}$) is applied to the left side of the first network device and the upper side of the second network device, and a second control voltage (IN2) of a control voltage ($V_{CG}$) is applied to the right side of the first network device and the lower side of the second network device.

Accordingly, when any one of the levels of a first control voltage ($V_{IN1}$) and a second control voltage ($V_{IN2}$) is a positive level, the universal logic memory cell 610 determines the level of an output voltage ($V_{OUT}$) as a positive level.

In addition, when the levels of a first control voltage ($V_{IN1}$) and a second control voltage ($V_{IN2}$) are both negative levels, the universal logic memory cell 610 determines the level of an output voltage ($V_{OUT}$) as a negative level.

In addition, when the levels of a first control voltage ($V_{IN1}$) and a second control voltage ($V_{IN2}$) are both zero levels or any one level is a zero level and the other level is a negative level, the universal logic memory cell 610 performs a ternary logic operation function of determining the level of an output voltage ($V_{OUT}$) as a zero level.

The timing diagram 611 shows that when an input corresponding to a combination of "−1", "0", and "1" is applied to two input voltages ($V_{IN1}$, $V_{IN2}$), a TOR logical operation related to a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 7A:
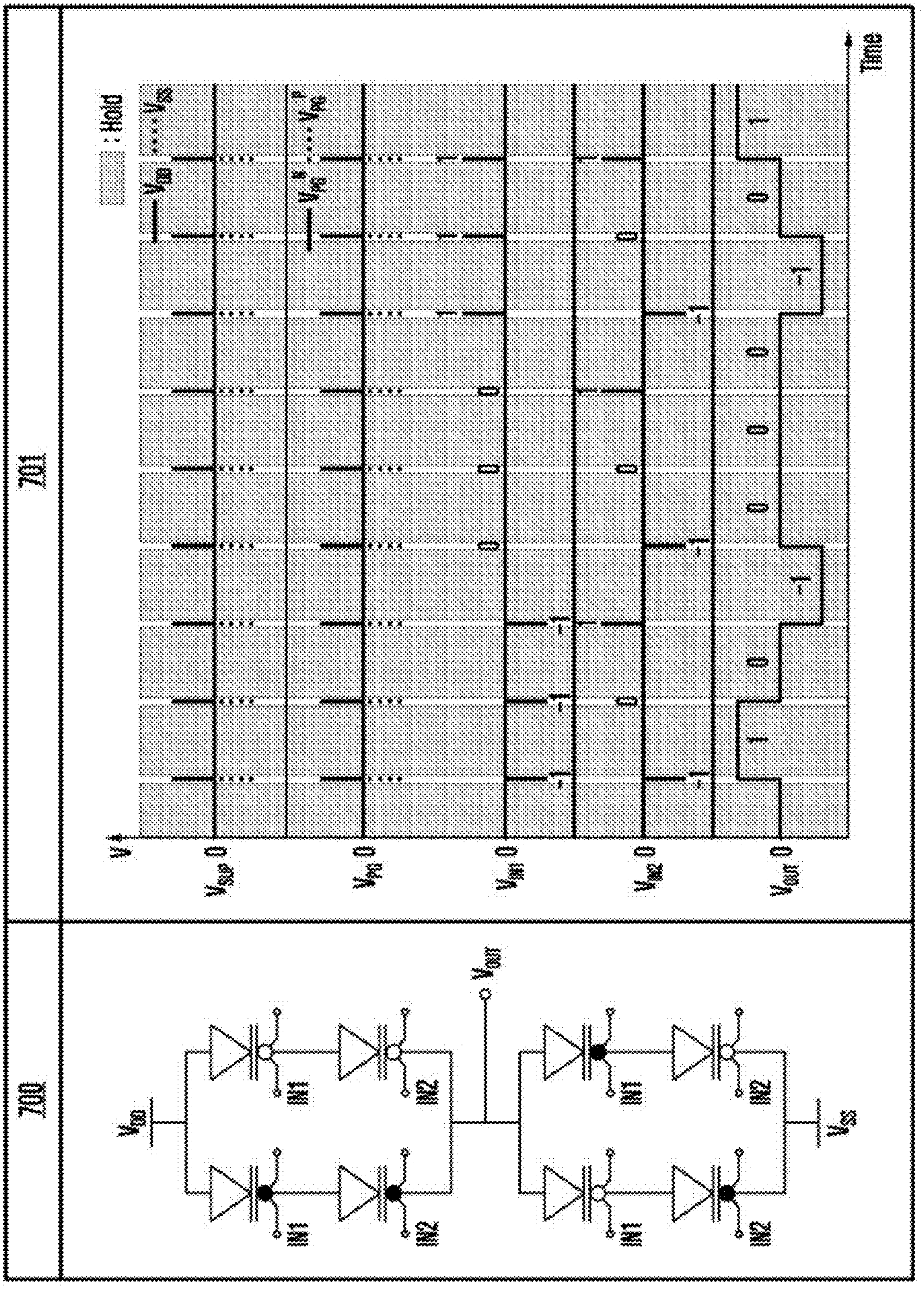
FIG. 7A is a diagram illustrating the TXNOR gate operation of a universal logic memory cell according to one embodiment of the present disclosure.

FIG. 7A is a diagram illustrating the TXNOR gate operation of a universal logic memory cell according to one embodiment of the present disclosure.

FIG. 7A illustrates a circuit diagram and timing diagram for a TXNOR gate operation of the universal logic memory cell according to one embodiment of the present disclosure.

Referring to FIG. 7A, in a universal logic memory cell 700 according to one embodiment of the present disclosure, the left side of the triple-gate silicon devices constituting the first network device operates in a first channel mode, and the right side thereof operates in a second channel mode. The upper left side of the triple-gate silicon devices constituting the second network device operates in a second channel mode, the upper right side thereof operates in a first channel mode, the lower left side thereof operates in a first channel mode, and the lower right side thereof operates in a second channel mode.

In the universal logic memory cell 700 according to one embodiment of the present disclosure, a first control voltage ($V_{IN1}$) of a control voltage ($V_{CG}$) is applied to an upper side of the first and second network devices, and a second control voltage ($V_{IN2}$) of a control voltage ($V_{CG}$) is applied to the lower side of the first and second network devices.

According to one embodiment of the present disclosure, when the levels of a first control voltage ($V_{IN1}$) and a second control voltage ($V_{IN2}$) are both negative levels, the universal logic memory cell 700 outputs the level of an output voltage ($V_{OUT}$) as a positive level.

When the levels of a first control voltage ($V_{IN1}$) and a second control voltage ($V_{IN2}$) are both positive levels, the universal logic memory cell 700 outputs the level of an output voltage ($V_{OUT}$) as a positive level.

In addition, when any one of the levels of a first control voltage ($V_{IN1}$) and a second control voltage ($V_{IN2}$) is a zero level, the universal logic memory cell 700 outputs the level of an output voltage ($V_{OUT}$) as a negative level.

In addition, when any one of the levels of a first control voltage ($V_{IN1}$) and a second control voltage ($V_{IN2}$) is a zero level, the universal logic memory cell 700 may perform a ternary logic operation function of determining the level of an output voltage ($V_{OUT}$) as a zero level.

The timing diagram 701 shows that when an input corresponding to a combination of "−1", "0", and "1" is applied to two input voltages ($V_{IN1}$, $V_{IN2}$), a TXNOR logical operation related to a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed. For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Figure 7B:
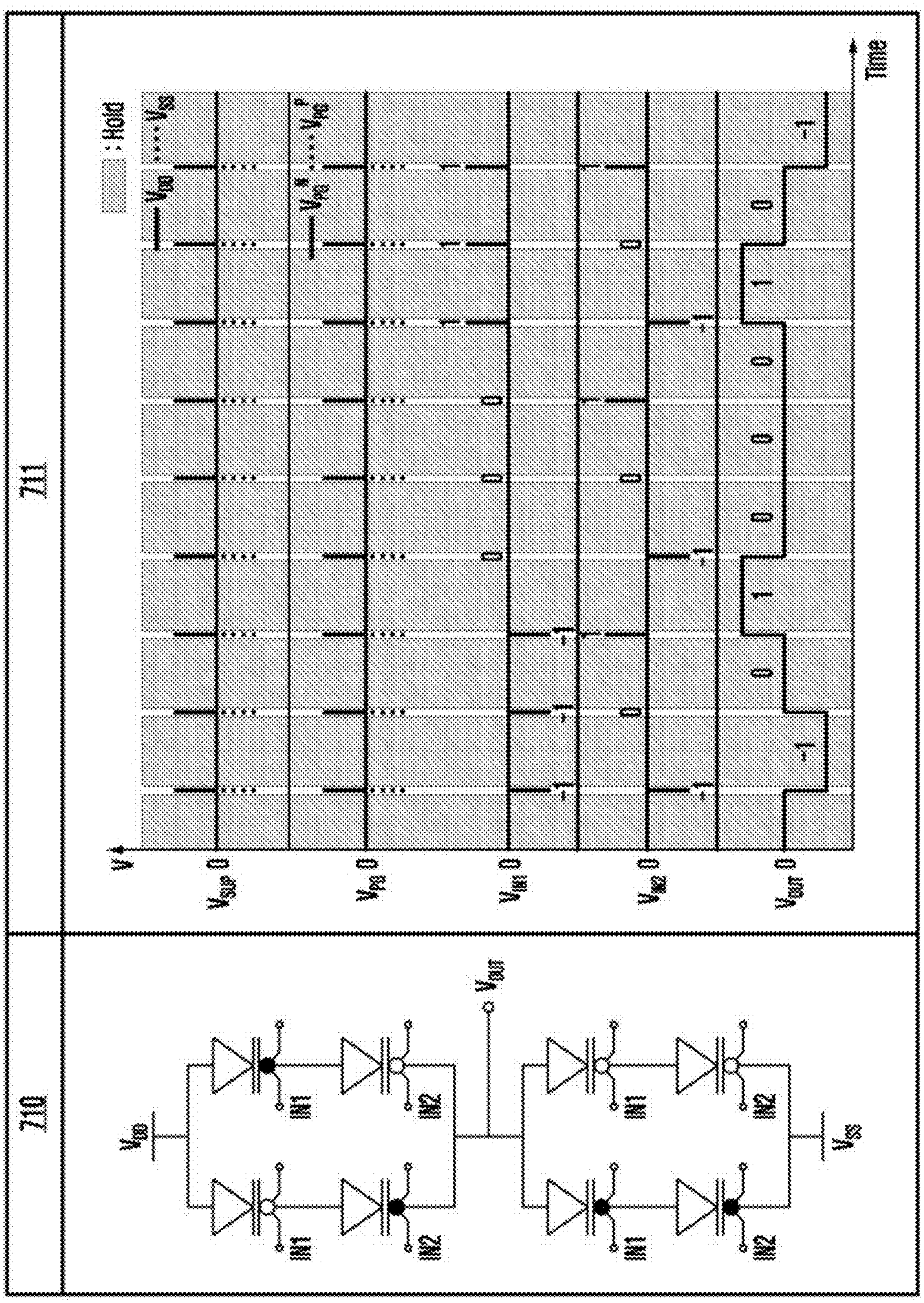
FIG. 7B is a diagram illustrating the TXOR gate operation of a universal logic memory cell according to one embodiment of the present disclosure.

FIG. 7B is a diagram illustrating the TXOR gate operation of a universal logic memory cell according to one embodiment of the present disclosure.

FIG. 7B illustrates a circuit diagram and timing diagram for a TXOR gate operation of the universal logic memory cell according to one embodiment of the present disclosure.

Referring to FIG. 7B, in a universal logic memory cell 710 according to one embodiment of the present disclosure, the upper left side of the triple-gate silicon devices constituting the first network device operates in a second channel mode, the upper right side thereof operates in a first channel mode, the lower left side thereof operates in a first channel mode, and the lower right side thereof operates in a second channel mode. The left side of the triple-gate silicon devices constituting the second network device operates in a first channel mode, and the right side thereof operates in a second channel mode.

In the universal logic memory cell 710 according to one embodiment of the present disclosure, a first control voltage ($V_{IN1}$) of a control voltage ($V_{CG}$) is applied to an upper side of the first and second network devices, and a second control voltage ($V_{IN2}$) of a control voltage ($V_{CG}$) is applied to the lower side of the first and second network devices.

In addition, when the levels of a first control voltage ($V_{IN1}$) and a second control voltage ($V_{IN2}$) are both negative or positive levels, the universal logic memory cell 710 determines the level of an output voltage ($V_{OUT}$) as a negative level.

In addition, when the levels of a first control voltage ($V_{IN1}$) and a second control voltage ($V_{IN2}$) are opposite to each other and are negative or positive levels, the universal logic memory cell 710 outputs the level of an output voltage ($V_{OUT}$) as a positive level.

In addition, when any one of the levels of a first control voltage ($V_{IN1}$) and a second control voltage ($V_{IN2}$) is a zero level, the universal logic memory cell 710 may perform a ternary logic operation function of determining the level of an output voltage ($V_{OUT}$) as a zero level.

The timing diagram 711 show that when an input corresponding to a combination of "−1", "0", and "1" is applied to two input voltages ($V_{IN1}$, $V_{IN2}$), a TXOR logical operation related to a ternary logic operation function is performed as values corresponding to "−1", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^{N}$) corresponding to the n-channel and the program voltage ($V_{PG}^{P}$) corresponding to the p-channel.

Accordingly, the present disclosure may improve processing speed and integration limitation due to data bottleneck through the fusion of logical operation and storage function.

In addition, the present disclosure may improve standby power efficiency by using channel mode reconfiguration characteristics and excellent memory characteristics that maintain logical operation values without structural changes and external biases.

The present disclosure can implement a universal logic memory cell that provides ternary logic operation function and memory function using a triple-gate silicon device driven by a positive feedback loop.

The present disclosure can implement a universal logic memory cell that performs all ternary basic logic operations in a single structure using a triple-gate silicon device and stores the results of the operations.

The present disclosure can implement a universal logic memory cell using a triple-gate silicon device, which is a silicon-based feedback memory device using a conventional CMOS process.

The present disclosure can improve processing speed and integration limitation due to data bottleneck through the fusion of logical operation and storage function.

The present disclosure can improve standby power efficiency by using channel mode reconfiguration characteristics and excellent memory characteristics that maintain logical operation values without structural changes and external biases.

In the above-described specific embodiments, elements included in the invention are expressed in singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

What is claimed is:

1. A universal logic memory cell, comprising a first network device and a second network device using a plurality of triple-gate silicon devices, wherein each of the triple-gate silicon devices comprises a drain region, a channel region, and a source region; a supply voltage is applied to the drain region and the source region; a gate region on which first and second programming gate electrodes and a control gate electrode are formed is formed on the channel region; depending on a level of a program voltage ($V_{PG}$) applied through the first and second programming gate electrodes, the channel region under the first and second programming gate electrodes operates in one of a first channel mode and a second channel mode; and the triple-gate silicon device is determined to be in either an on-state or an off-state based on a level of a control voltage ($V_{CG}$) applied through the control gate electrode, and the first and second network devices perform a ternary logic operation function and a memory function by determining a level of an output voltage ($V_{OUT}$) as one of a positive level, a zero level, and a negative level depending on any one of the states in any one of the channel modes, wherein the first and second network devices are composed of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween, a drain voltage ($V_{DD}$) of the common voltage is applied through the first parallel connection of the first network device, a source voltage ($V_{SS}$) of the common voltage is applied through the second parallel connection of the second network device, and an output voltage ($V_{OUT}$) is measured at a point where the second parallel connection of the first network device and the first parallel connection of the second network device are connected, and wherein, when the first network device operates in the second channel mode and the second network device operates in the first channel mode, a level of the output voltage ($V_{OUT}$) is determined as a positive level when a level of the control voltage ($V_{CG}$) is a negative level, a level of the output voltage ($V_{OUT}$) is determined as a negative level when a level of the control voltage ($V_{CG}$) is a positive level, and a level of the output voltage ($V_{OUT}$) is determined as a zero level when a level of the control voltage ($V_{CG}$) is a zero level, such that the ternary logic operation function is performed.

2. The universal logic memory cell according to claim 1, wherein, when the first network device operates in the first channel mode and the second network device operates in the second channel mode, the ternary logic operation function of determining a level of the output voltage ($V_{OUT}$) as a negative level when a level of the control voltage ($V_{CG}$) is a negative level, determining a level of the output voltage ($V_{OUT}$) as a positive level when a level of the control voltage ($V_{CG}$) is a positive level, and determining a level of the output voltage ($V_{OUT}$) as a zero level when a level of the control voltage ($V_{CG}$) is a zero level is performed.

3. The universal logic memory cell according to claim 1, wherein the ternary logic operation function of determining a level of the output voltage ($V_{OUT}$) as a positive level when the first network device operates in the second channel mode, the second network device operates in the first channel mode, a first control voltage ($V_{IN1}$) of the control voltage ($V_{CG}$) is applied to a left side of the first network device and an upper side of the second network device, a second control voltage ($V_{IN2}$) of the control voltage ($V_{CG}$) is applied to a right side of the first network device and a lower side of the second network device, and any one level of levels of the first control voltage ($V_{IN1}$) and the second control voltage ($V_{IN2}$) is a negative level, determining a level of the output voltage ($V_{OUT}$) as a negative level when levels of the first control voltage ($V_{IN1}$) and the second control voltage ($V_{IN2}$) are both positive levels, and determining a level of the output voltage ($V_{OUT}$) as a zero level when levels of the first control voltage ($V_{IN1}$) and the second control voltage ($V_{IN2}$) are both zero levels or one level is a zero level and the other level is a positive level is performed.

4. The universal logic memory cell according to claim 1, wherein the ternary logic operation function of determining a level of the output voltage ($V_{OUT}$) as a negative level when the first network device operates in the second channel mode, the second network device operates in the first channel mode, a first control voltage ($V_{IN1}$) of the control voltage ($V_{CG}$) is applied to an upper side of the first network device and a left side of the second network device, a second control voltage ($V_{IN2}$) of the control voltage ($V_{CG}$) is applied to a lower side of the first network device and a right side of the second network device, and any one level of levels of the first control voltage ($V_{IN1}$) and the second control voltage ($V_{IN2}$) is a positive level, determining a level of the output voltage ($V_{OUT}$) as a positive level when levels of the first control voltage ($V_{IN1}$) and the second control voltage ($V_{IN2}$) are both negative levels, and determining a level of the output voltage ($V_{OUT}$) as a zero level when levels of the first control voltage ($V_{IN1}$) and the second control voltage ($V_{IN2}$) are both zero levels or one level is a zero level and the other level is a negative level is performed.

5. The universal logic memory cell according to claim 1, wherein the ternary logic operation function of determining a level of the output voltage ($V_{OUT}$) as a negative level when the first network device operates in the first channel mode, the second network device operates in the second channel mode, a first control voltage ($V_{IN1}$) of the control voltage ($V_{CG}$) is applied to an upper side of the first network device and a left side of the second network device, a second control voltage ($V_{IN2}$) of the control voltage ($V_{CG}$) is applied to a lower side of the first network device and a right side of the second network device, and any one level of levels of the first control voltage ($V_{IN1}$) and the second control voltage ($V_{IN2}$) is a negative level, determining a level of the output voltage ($V_{OUT}$) as a positive level when levels of the first control voltage ($V_{IN1}$) and the second control voltage ($V_{IN2}$) are both positive levels, and determining a level of the output voltage ($V_{OUT}$) as a zero level when levels of the first control voltage ($V_{IN1}$) and the second control voltage ($V_{IN2}$) are both zero levels or any one level is a zero level and the other level is a positive level is performed.

6. The universal logic memory cell according to claim 1, wherein the ternary logic operation function of determining a level of the output voltage ($V_{OUT}$) as a positive level when the first network device operates in the second channel mode, the second network device operates in the first channel mode, a first control voltage ($V_{IN1}$) of the control voltage ($V_{CG}$) is applied to a left side of the first network device and an upper side of the second network device, a second control voltage ($V_{IN2}$) of the control voltage ($V_{CG}$) is applied to a right side of the first network device and a lower side of the second network device, and any one level of levels of the first control voltage ($V_{IN1}$) and the second control voltage ($V_{IN2}$) is a positive level, determining a level of the output voltage ($V_{OUT}$) as a negative level when levels of the first control voltage ($V_{IN1}$) and the second control voltage ($V_{IN2}$) are both negative levels, and determining a level of the output voltage ($V_{OUT}$) as a zero level when levels of the first control voltage ($V_{IN1}$) and the second control voltage ($V_{IN2}$) are both zero levels or any one level is a zero level and the other level is a negative level is performed.

7. The universal logic memory cell according to claim 1, wherein the ternary logic operation function of determining a level of the output voltage ($V_{OUT}$) as a positive level when a left side of the first network device operates in the first channel mode, a right side of the first network device operates in the second channel mode, an upper left side of the second network device operates in the second channel mode, an upper right side of the second network device operates in the first channel mode, a lower left side of the second network device operates in the first channel mode, a lower right side of the second network device operates in the second channel mode, a first control voltage ($V_{IN1}$) of the control voltage ($V_{CG}$) is applied to an upper side of the first and second network devices, a second control voltage ($V_{IN2}$) of the control voltage ($V_{CG}$) is applied to a lower side of the first and second network devices, and levels of the first control voltage ($V_{IN1}$) and the second control voltage ($V_{IN2}$) are both negative or positive levels, determining a level of the output voltage ($V_{OUT}$) as a negative level when levels of the first control voltage ($V_{IN1}$) and the second control voltage ($V_{IN2}$) are opposite to each other and are negative or positive levels, and determining a level of the output voltage ($V_{OUT}$) as a zero level when any one level of levels of the first control voltage ($V_{IN1}$) and the second control voltage ($V_{IN2}$) is a zero level is performed.

8. The universal logic memory cell according to claim 1, wherein the ternary logic operation function of determining a level of the output voltage ($V_{OUT}$) as a negative level when an upper left side of the first network device operates in the second channel mode, an upper right side of the first network device operates in the first channel mode, a lower left side of the first network device operates in the first channel mode, a lower right side of the first network device operates in the second channel mode, a left side of the second network device operates in the first channel mode, a right side of the second network device operates in the second channel mode, a first control voltage ($V_{IN1}$) of the control voltage ($V_{CG}$) is applied to an upper side of the first and second network devices, a second control voltage ($V_{IN2}$) of the control voltage ($V_{CG}$) is applied to a lower side of the first and second network devices, and levels of the first control voltage ($V_{IN1}$) and the second control voltage ($V_{IN2}$) are both positive levels, determining a level of the output voltage ($V_{OUT}$) as a negative level when levels of the first control voltage ($V_{IN1}$) and the second control voltage ($V_{IN2}$) are both negative levels, outputting a level of the output voltage ($V_{OUT}$) as a positive level when levels of the first control voltage ($V_{IN1}$) and the second control voltage ($V_{IN2}$) are opposite to each other and are negative or positive levels, and determining a level of the output voltage ($V_{OUT}$) as a zero level when either of levels of the first control voltage ($V_{IN1}$) and the second control voltage ($V_{IN2}$) is a zero level is performed.

9. The universal logic memory cell according to claim 1, wherein the drain region is in a p-doped state;

the source region is in an n-doped state;

the channel region is in an intrinsic state; and the channel region under the first and second programming gate electrodes operates as an n-channel corresponding to the first channel mode when a level of the program voltage ($V_{PG}$) is a positive level and operates as a p-channel corresponding to the second channel mode when a level of the program voltage ($V_{PG}$) is a negative level.

10. The universal logic memory cell according to claim 9, wherein, when a drain voltage ($V_{DD}$) applied to the drain region, a source voltage ($V_{SS}$) applied to the source region, the program voltage ($V_{PG}$), and the control voltage ($V_{CG}$) are applied at a zero level, the memory function is performed by maintaining a level of the output voltage ($V_{OUT}$).

11. The universal logic memory cell according to claim 1, wherein, when the channel region under the first and second programming gate electrodes operates in the first channel mode, each of the triple-gate silicon devices is determined to be in an on-state when a level of the applied control gate voltage ($V_{CG}$) is higher than a latch-up voltage, which is a voltage at which current increases rapidly, and is determined to be in an off-state when a level of the applied control gate voltage ($V_{CG}$) is lower than the latch-up voltage.

12. The universal logic memory cell according to claim 11, wherein, when the channel region under the first and second programming gate electrodes operates in the first channel mode and a level of the applied control voltage ($V_{CG}$) is higher than the latch-up voltage, each of the triple-gate silicon devices has a lowered potential barrier height between the channel region under the control gate electrode and the channel region under the second programming gate electrode adjacent to the source region and becomes the on-state, where current flows due to a first positive feedback loop in which electrons are injected from the source region due to the lowered potential barrier.

13. The universal logic memory cell according to claim 1, wherein, when the channel region under the first and second programming gate electrodes operates in the second channel mode, each of the triple-gate silicon devices is determined to be in an off-state when a level of the applied control gate voltage ($V_{CG}$) is higher than a latch-up voltage, which is a voltage at which current increases rapidly, and is determined to be in an on-state when a level of the applied control gate voltage ($V_{CG}$) is lower than the latch-up voltage.

14. The universal logic memory cell according to claim 13, wherein, when the channel region under the first and second programming gate electrodes operates in the second channel mode, when a level of the applied control voltage ($V_{CG}$) is lower than the latch-up voltage, each of the triple-gate silicon devices has a lowered potential barrier height between the channel region under the control gate electrode and the channel region under the first programming gate electrode adjacent to the drain region and becomes the on-state, where current flows due to a second positive feedback loop in which holes are injected from the drain region due to the lowered potential barrier.

* * * * *